United States Patent
Suenaga et al.

(10) Patent No.: US 6,547,660 B1
(45) Date of Patent: Apr. 15, 2003

(54) SEMICONDUCTOR MANUFACTURING FACILITY, SEMICONDUCTOR MANUFACTURING APPARATUS AND SEMICONDUCTOR MANUFACTURING METHOD

(75) Inventors: Osamu Suenaga, Koufu (JP); Tadahiro Ohmi, 1-17-301, Komegafukuro 2-Chome, Aoba-Ku, Sendai-Shi, Miyagi 980-0813 (JP); Sadao Kobayashi, Yokohama (JP)

(73) Assignees: Tokyo Electron Limited, Tokyo (JP); Tadahiro Ohmi, Sendai (JP); Taisei Corporation, Tokyo (JP)

( * ) Notice: Subject to any disclaimer, the term of this patent is extended or adjusted under 35 U.S.C. 154(b) by 0 days.

(21) Appl. No.: 09/669,909

(22) Filed: Sep. 27, 2000

Related U.S. Application Data

(63) Continuation of application No. PCT/JP00/04311, filed on Jun. 29, 2000.

(30) Foreign Application Priority Data

Jul. 2, 1999 (JP) .......................................... 11-189741

(51) Int. Cl.⁷ ................................................. B01L 1/04
(52) U.S. Cl. ........................ 454/187; 414/935; 414/940
(58) Field of Search .......................... 454/187; 414/935, 414/940

(56) References Cited

U.S. PATENT DOCUMENTS

| | | | |
|---|---|---|---|
| 5,001,327 A | * 3/1991 | Hirasawa et al. | 219/390 |
| 5,251,688 A | * 10/1993 | Schatz | 165/10 |
| 5,303,482 A | * 4/1994 | Yamashita et al. | 34/80 |
| 5,314,538 A | * 5/1994 | Maeda et al. | 118/715 |
| 5,462,397 A | * 10/1995 | Iwabuchi | 414/222 |
| 5,562,383 A | * 10/1996 | Iwai et al. | 414/217 |
| 5,747,780 A | * 5/1998 | Shioyama et al. | 219/648 |
| 5,900,047 A | * 5/1999 | Rodriguez et al. | 96/243 |
| 6,024,502 A | * 2/2000 | Akimoto et al. | 396/579 |
| 6,042,372 A | * 3/2000 | Sakata et al. | 432/241 |

FOREIGN PATENT DOCUMENTS

| | | |
|---|---|---|
| JP | 1-111865 | 4/1989 |
| JP | 3-117840 | 5/1991 |
| JP | 4-158513 | 6/1992 |
| JP | 8-31707 | 2/1996 |
| JP | 9-43211 | 2/1997 |
| JP | 9-113120 | 5/1997 |

* cited by examiner

Primary Examiner—Derek Boles
(74) Attorney, Agent, or Firm—Pillsbury Winthrop LLP

(57) ABSTRACT

A semiconductor manufacturing facility is provided, which can reduce a thermal load in a clean room and reduce an amount of energy thereof. Semiconductor manufacturing equipment, which generates heat when it is used, is installed in the clean room and is covered by a housing. The housing is configured to be capable of introducing the air inside the clean room into an interior thereof. The air inside the housing is exhausted outside the clean room through a plurality of exhaust passage members. A heat insulating material is associated with the housing to reduce the release of heat from the housing to the air inside the clean room. A space between the housing and the semiconductor manufacturing equipment may be hermetically sealed, and an air introducing member may be connected to the housing to take air outside the clean room into the hermetically sealed space.

23 Claims, 11 Drawing Sheets

FIG. 8

| TEST NO.<br>ITEM | 1<br>PRESENT INVENTION | 2<br>PRESENT INVENTION | 3<br>COMPARATIVE EXAMPLE | 4<br>COMPARATIVE EXAMPLE | 5<br>COMPARATIVE EXAMPLE | 6<br>PRESENT INVENTION (JUNE) | 7<br>PRESENT INVENTION (JANUARY) | 8<br>COMPARATIVE EXAMPLE (JUNE) | 9<br>COMPARATIVE EXAMPLE (JANUARY) | 10<br>PRESENT INVENTION (JUNE) |
|---|---|---|---|---|---|---|---|---|---|---|
| HOUSING INSULATION | YES | YES | NO | NO | YES | YES | YES | NO | NO | YES |
| LOCATION OF INSULATION | HOUSING | HOUSING | — | — | — | PERIRERY OF FARNACE | PERIRERY OF FARNACE | — | — | PERIRERY OF FARNACE |
| KIND OF INSULATION MATERIAL | ORGANIC FOAM MATERIAL (NO CONTAMINANT) | ORGANIC FOAM MATERIAL (NO CONTAMINANT) | — | — | ORGANIC FOAM MATERIAL (NO CONTAMINANT) | INORGANIC INSULATING MATERIAL | INORGANIC INSULATING MATERIAL | — | — | INORGANIC INSULATING MATERIAL |
| THICKNESS | 20 | 20 | — | — | 20 | 30 | 30 | — | — | 30 |
| GASEOUS CONTAMINANT FROM INSULATING MATERIAL | NO | NO | — | — | ORGANIC ESTER PHOSPHATE | BORON | BORON | — | — | BORON |
| GASEOUS CONTAMINANT FROM PANEL | NOT DETECTED | NO | — | — | ORGANIC ESTER PHOSPHATE | NOT DETECTED | NOT DETECTED | — | — | BORON |
| EXHAUST AIR | CR AIR | CR AIR | CR AIR | CR AIR | CR AIR | OUTSIDE AIR | OUTSIDE AIR | OUTSIDE AIR | OUTSIDE AIR | OUTSIDE AIR |
| INSULATION OF EXHAUST DUCT | YES | NO | NO | YES | YES | YES | YES | NO | NO | YES |
| KIND OF INSULATION MATERIAL | ORGANIC FOAM MATERIAL (NO CONTAMINANT) | — | — | ORGANIC FOAM MATERIAL (NO CONTAMINANT) | ORGANIC FOAM MATERIAL (NO CONTAMINANT) | INORGANIC INSULATING MATERIAL | INORGANIC INSULATING MATERIAL | — | — | INORGANIC INSULATING MATERIAL |
| THICKNESS OF INSULATING MATERIAL | 20 | — | — | — | 20 | 30 | 30 | — | — | 30 |
| POWER SAVING EFFECT OF INSULATION | 52 | 41 | 0 | 17.4 | 51 | 52 | 51 | 0 | 0 | 52 |
| EFFECT OF USE OF OUTSIDE AIR | 0 | 0 | 0 | 0 | 0 | | | 0 | 0 | |
| (TOTAL) (KWh/day) | 52 | 41 | 0 | 17.4 | 51 | | | 0 | 0 | |
| LOCATION OF DEW FORMATION | NO | NO | NO | NO | NO | NO | NO | INSIDE OF DUCT OUTSIDE OF HOUSING | INSIDE OF DUCT OUTSIDE OF HOUSING | NO |
| MEASUREMENT OF OUT-GAS (INCREASED ORGANIC MATERIAL THAN CR) | NO | NO | NO | NO | ORGANIC ESTER PHOSPHATE | NO | NO | NO | NO | NO |
| ORGANIC MATERIAL (INCREASED INORGANIC MATERIAL THAN CR) | NO | NO | NO | NO | NO | NO | NO | NO | NO | BORON |

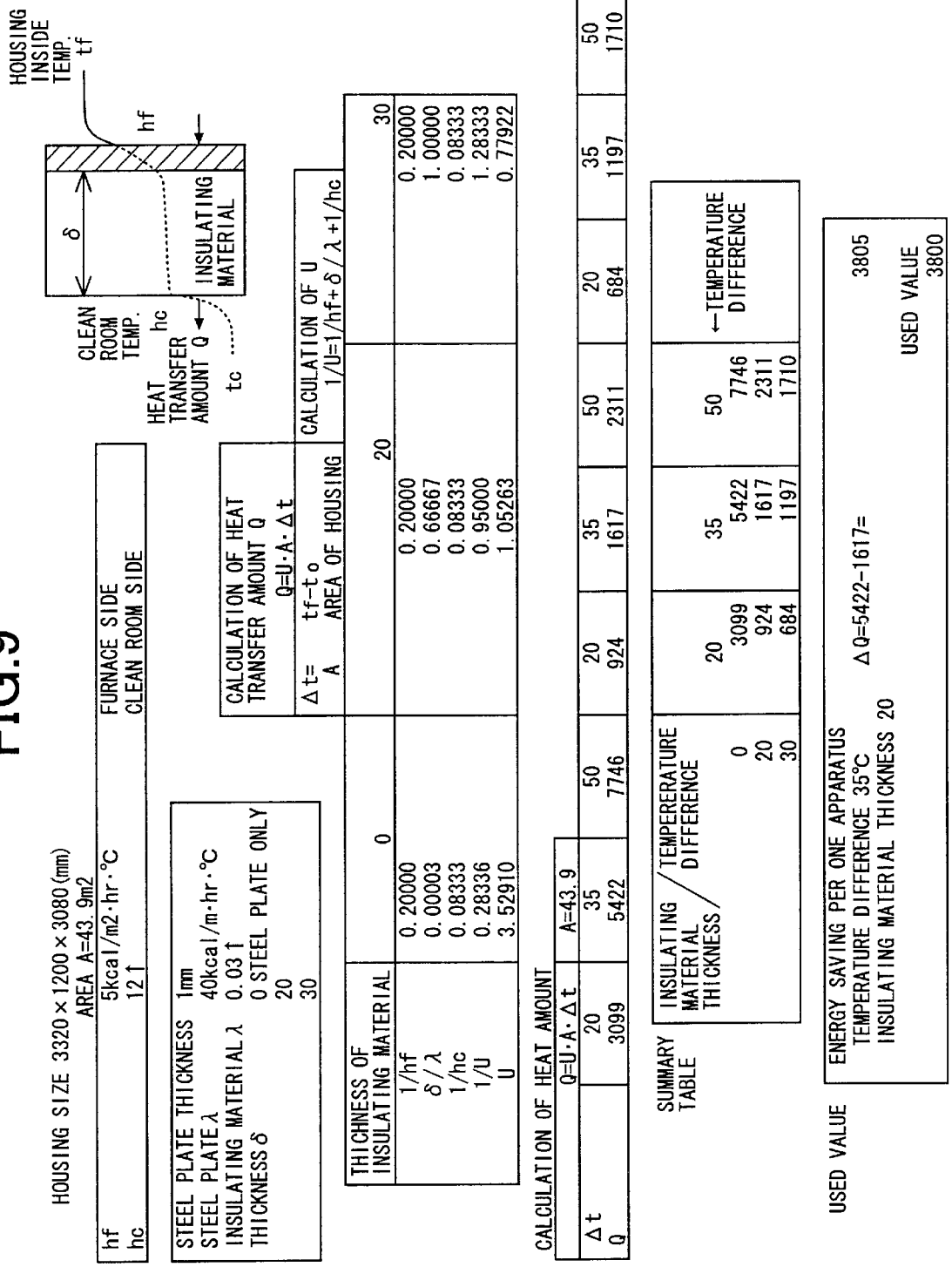

FIG.11

(1) BLOWER POWER

| | | | | |
|---|---|---|---|---|
| NUMBER OF APPARATUSES | 5 | | | |
| EXHAUST AMOUNT | 4000 | m3/h | | |
| NUMBER | 20000 | | | |
| PERFORMANCE | 23800 | | | |

| | CURRENT STAGE | PATENT | | |
|---|---|---|---|---|
| EXHAUST FAN POWER | 11kW×24hr | 11kW×24hr | SAME | |
| | 264 | 264 | | |
| EXTERNAL UNIT | 15kW×2×24hr | 18.5kw×24hr | DOWN | |
| kWh/day | 720 | 444 | 276 | |
| kcal/day | 619200 | 381840 | 237360 | |
| PER UNIT | 123840 | 76368 | DIFFERENCE 47472 | USED VALUE 47500 |

(2) REFRIGERATING MACHINE

| | DESIGN | UNIT | HALF | UNIT | REMARKS |
|---|---|---|---|---|---|
| AIR AMOUNT | 4000 | m3/hr | 2000 | m3/hr | |
| SPECIFIC HEAT OF AIR | 0.24 | kcal/kg·°C | SAME | | |
| TEMPERTURE DIFFERENCE (Δt) | 14 | °C | 14 | °C | 30→14°C |
| EQUATION | Q=W*op*Δt | | | | |
| mol NUMBER | 178571 | mol | 89268 | mol | 1mol=22.4L |
| MOLECULAR WEIGHT OF AIR | 29 | g/mol | SAME | | |
| | 5178571 | g | 2589286 | g | |
| WEIGHT | 5179 | kg | 2589 | kg | |

| CALCULATION FOR REFRIGERATING MACHINE | | | | | |
|---|---|---|---|---|---|
| Q= | 17400 | kcal/hr · PER MACHINE | Q= | 8699 | kcal/hr · PER MACHINE |
| PER DAY | 417600 | kcal/day · PER DAY | PER DAY | 208777 | kcal/day · PER DAY |
| BLOWER POWER | 123840 | | BLOWER POWER | 76368 | |
| TOTAL | 541440 | | TOTAL | 285145 | |
| | DIFFERENCE 256295 | | USED VALUE 256000 | | kcal/day · PER DAY |

541440−285145= 256295

SEMICONDUCTOR MANUFACTURING FACILITY, SEMICONDUCTOR MANUFACTURING APPARATUS AND SEMICONDUCTOR MANUFACTURING METHOD

This is a continuation of International Appln. No. PCT/JP00/04311 filed Jun. 29, 2000.

TECHNICAL FIELD

The present invention relates to semiconductor manufacturing facilities and, more particularly to a semiconductor manufacturing facility including semiconductor manufacturing equipment which generates heat in operation in manufacture of semiconductor devices and a semiconductor manufacturing apparatus installed in the semiconductor manufacturing facility and a semiconductor manufacturing method.

BACKGROUND ART

Semiconductor manufacturing equipment is installed in a clean room in which clean air is circulated, and located in an environment in which a surface of a silicon wafer on which a semiconductor manufacturing circuit is formed is not contaminated. AN air filter is installed on the ceiling of the clean room so that the air filtered by the air filter flows around the semiconductor manufacturing equipment. Supply of air to the air filter is performed by a blower mounted on an upstream side of the air filter. The air in the clean room is introduced into a return passage provided to a floor or a side wall, and a temperature and humidity is adjusted therein. Thereafter, the air returns to a plenum chamber above the ceiling board, and is supplied to the clean room after dust is removed therefrom by the air filter. First, dust having a large particle diameter is removed from the air supplied to the clean room. Thereafter, metal ions such as natrium, negative ions such as sulfate ions and ammonia ions are removed by being subjected to water cleaning or using a chemical filter. The humidity and temperature of the treated is adjusted, and fine dust is removed, and the air is supplied to the plenum chamber.

As mentioned above, a large amount of energy is consumed as a power for cleaning process of air and a power for controlling temperature and humidity so as to produce the air used for a clean room.

Many sets of semiconductor manufacturing equipment use heat for raising temperature of wafers in a manufacturing process. One of those sets of semiconductor manufacturing equipment is a vertical heat treatment apparatus, which is a batch type heat treatment apparatus. FIG. 1 is a cross-sectional view of a conventional vertical heat treatment apparatus with an air cooling apparatus. The vertical heat treatment apparatus is installed in a clean room 1.

In FIG. 1, a heating furnace 12, which corresponds to the semiconductor manufacturing equipment, is provided in an upper portion of a housing 11, which forms an outer covering part of the apparatus. The heating furnace 12 comprises: a cylindrical quartz pipe 13 which is a reaction tube having an open lower end; a heater 14 arranged to surround the quarts pipe 13; and a heat insulating layer 15 comprising an insulating material provided to surround the heater 14 and a water cooling pipe. The cooling water is supplied trough an inlet pipe 15a, and exits from an outlet pipe 15b. A lower part of the housing 11 constitutes a wafer loader chamber 10, and a support tool 17, on which a wafer is placed, is moved upward by an elevator 16 so that the support tool 17 can be carried in the quartz tube 13.

In the thus-structured vertical heat treatment apparatus, when an oxidation process is applied to the wafer, for example, since inside the heating furnace 12 reaches a temperature as high as 1000° C., a heat inside the heating furnace 12 is emitted to outside the insulating layer 15 even if the heating furnace 12 is covered by the heat insulating layer 15. After the oxidation process is completed, the high-temperature wafer placed on the wafer boat in the heating furnace 12 is moved downward by the elevator, and is taken out of the heating furnace 12. At this time, the high-temperature According to this cause, the air surrounding the heating furnace 12 and the air in the wafer loader chamber 10, when the wafer is taken out, reach several ten degrees. Due to the heat, the air in the periphery of the heat treatment apparatus is warmed, and the temperature in the clean room 1 is raised. Conventionally, in order to prevent the temperature of the clean room 1 increased from being raised, the air in the clean room is exhausted as follows.

A horizontal separation board 21 is provided between the upper portion and the lower portion of the housing 11, and, in an area above the separation board 21, the air in the clean room 1 is taken in between the heating furnace 12 and the housing 11 through air intake ports 22 and 23, and the air is exhausted through an exhaust duct 24 provided in the upper portion of the housing 11. Additionally, in an area under the separation board 21, the air in the clean room 1 is taken in the wafer loader chamber 10, and the air is exhausted trough an exhaust duct 25. A fan 18 is provided in the wafer loader chamber 10. The fan 18 circulates the air in the wafer loader chamber 10, and the air in the clean room 1 is mixed to the circulated air. It should be noted that the exhaust duct 25 is provided along the ceiling of the clean room, and is connected to an exhaust line of the plant.

As mentioned above, the heat emitted from the heating furnace 12 is released outside the clean room 1 by passing through the exhaust ducts 24 and 25. However, a part of heat emitted from the heating furnace 12 is released outside the clean room by transmitting walls of the exhaust ducts 24 and 25. Accordingly, the part of heat emitted from the heating furnace 12 is released outside the clean room by a cooling facility provided in the circulation passage (return passage) in the clean room 1.

The present inventors took a measurement of an amount of energy consumed by a dry coil (cooling coil), which is the cooling facility for cooling the air in the clean room 1 (the clean room 1 is actually a large room although drawn as a small room in FIG. 2) while performing exhaust according to the above-mentioned conventional exhaust method, in a state in which the heating furnace 12 is being operated.

In FIGS. 2, 3 indicates a laboratory; 1 indicates the clean room provided in the laboratory 1; 32 indicates an air introducing pipe; 33 indicates a temperature and humidity adjusting part (external adjusting machine); 34 indicates an air circulation passage formed under the floor and an outer side of a side wall of the clean room; F indicates an air filter; 35 indicates a dry coil; 35a indicates a cooling part for cooling a coolant flowing in the dry coil 35; 36 indicates a separation enclosure (corresponding to the housing 11 of FIG. 1) accommodating a vertical heat treatment apparatus; 37 indicates an exhaust duct (corresponding to the exhaust duct 24 of FIG. 1); 38 indicates an exhaust fan; 39a indicates a cooling-water passage for cooing the heating furnace; and 39b indicates a facility for cooling the cooling water.

That is, after the outside air is taken in through the air introducing pipe 32 and the temperature and humidity of the air is adjusted by the temperature and humidity adjusting part (external adjusting machine) 33, the air is supplied to the clean room 1 via the filter F. The temperature of the air in the clean room 1 is maintained, for example, at 23° C. by the dry coil 35 while being circulated through the circulation passage 34. In side the heating furnace of the vertical heat treatment apparatus is raised to, for example, a predetermined temperature of 1000° C., and the heat released outside the heating furnace is released outside the laboratory through the exhaust duct 37 (the ducts 24 and 25 of FIG. 1 are collectively indicated by a single path). The heat released outside the heating furnace 1) escapes outside through the exhaust duct 37; 2) transmits inside the clean room 1 through the wall of the exhaust duct 37 or the separation enclosure 36 and is removed by the dry coil 35; or 3) is removed by the cooling water of the cooling-water passage 39a. In 1), 2) and 39, an energy consumption for removing the heat transmitted from the heating furnace is obtained, respectively, and a running cost (for example, a power supplied to a pump for delivering the coolant) is calculated which power corresponds to the amount of energy consumption. As a result, it was found that the cost for releasing the heat by 1) exceeds 50% of the total cost of 1), 2) and 3).

Conventionally, such measurement has not been performed. According to the above-mentioned experiments by the inventors, it was found that the heat from the heating furnace cannot be removed by the local exhaust of the air surrounding the furnace, and a large part of the heat from the heating furnace moves to the air in the clean room by heat conduction or heat radiation and thus a large amount of energy is needed to cool the circulated air in the clean room due to an operation of the heating furnace. Accordingly, the conventional cooling method by the exhaust of air in the clean room has problems in that, first, a loss is generated due to a large amount of air being exhausted which air insufficiently absorbing heat and, second, a loss is generated due to heat, which should be removed by the exhaust air, leaking to the clean room 1 and cooling must be performed to remove the heat.

Conventionally, the air in the clean room is frequently circulated so as to remove heat from the clean room to maintain the setting temperature (for example, 23° C.). Thus, in order to reduce the running cost of the clean room 1, a suggestion has been made to reduce the number of circulations of the air in the clean room, however, such a suggestion cannot be realized as long as the heat from the semiconductor manufacturing equipment generating heat is not released to the air in the clean room 1. Additionally, although a suggestion has been made to use outside air for air cooling for the above-mentioned purpose, there is a problem in that dew formation occurs in the periphery of the apparatus. Accordingly, at the present time, outside air cannot be use for cooling the semiconductor manufacturing equipment generating heat.

The present invention has been accomplished in view of findings obtained by measurement of a heat balance of semiconductor manufacturing equipment, which generates heat in an operating state in a clean room.

DISCLOSURE OF INVENTION

It is an object of the present invention to provide an improved and useful cooling apparatus and a semiconductor manufacturing apparatus provided with such a cooling apparatus.

A more specific object of the present invention is to positively remove air by an exhaust, which air is warmed heat conduction or heat radiation by semiconductor manufacturing equipment generating heat so as to reduce a thermal load to the clean room and reduce an amount of energy consumption.

In order to achieve the above-mentioned objects, there is provided according to one aspect of the present invention a semiconductor manufacturing facility comprising:

a clean room;

a semiconductor manufacturing equipment provided in the clean room and generating heat during use;

a housing covering the semiconductor manufacturing equipment and configured to be capable of introducing air inside the clean room into an interior thereof; and exhaust passage members for exhausting air in the housing to outside the clean room, characterized in that:

release of heat from the housing to the air inside the clean room is prevented by providing a heat insulating material to the housing.

According to the above-mentioned invention, diffusion of heat from the semiconductor manufacturing equipment to the clean room can be reduced by the heat insulating material provided to the housing. Additionally, if the heat insulating material is provided also to the exhaust passage members, the diffusion of heat to the clean room can be further reduced.

There is provided according another aspect of the present invention a semiconductor manufacturing facility comprising:

a clean room;

a semiconductor manufacturing equipment provided in the clean room and generating heat during use;

a housing configured to cover the semiconductor manufacturing equipment; and exhaust passage members for exhausting air in the housing to outside the clean room, characterized in that:

a separation and enclosure member is provided to isolate the housing from an atmosphere of the clean room by enclosing the housing, the separation and enclosure member configured to be capable of introducing the air in the clean room into an interior thereof; and a heat insulating material is provided to the separation and enclosure member, thereby preventing heat from being released from the interior of the separation and enclosure member to the air inside the clean room.

According to the above-mentioned invention, since the housing, which covers the semiconductor manufacturing equipment, is isolated from the atmosphere of clean room by the separation and enclosure member provided with the heat insulating material, diffusion of heat from the semiconductor manufacturing equipment to the clean room can be reduced. In this case, a space between the housing and the semiconductor manufacturing equipment may be rendered to be a hermetically sealed space, and an air introducing passage member may be connected to the housing so as to take air outside the clean room into the hermetically sealed space.

Additionally, there is provided according to another aspect of the present invention a semiconductor manufacturing facility comprising:

a clean room;

a semiconductor manufacturing equipment provided in the clean room and generating heat during use;

a housing configured to cover the semiconductor manufacturing equipment; and exhaust passage members for exhausting air in the housing to outside the clean room, characterized in that:

an air introducing passage member is provided so as to introduce air outside the clean room into the housing; and a heat insulating material is provided to the housing, thereby preventing heat from being released from the interior of the housing to the air inside the clean room.

According to the above-mentioned invention, since a space between the housing and the semiconductor manufacturing equipment is rendered to be a hermetically sealed space and the air introducing passage member is connected to the housing so as to take air outside the clean room into the hermetically sealed space, the cooling of the semiconductor manufacturing equipment can be performed without using the air in the clean room. Accordingly, diffusion of heat from the semiconductor manufacturing equipment to the clean room can be reduced. In this case, diffusion of heat from the semiconductor manufacturing equipment to the clean room can be further reduced by providing a heat insulating material to the exhaust passage member. Additionally, if a heat insulating material is provided to the air introducing passage member, dew formation on the air introducing passage member can be prevented.

Additionally, there is provided according to a further aspect of the present invention a semiconductor manufacturing facility comprising:

a clean room;

a semiconductor manufacturing equipment provided in the clean room and generating heat during use;

a housing configured to cover the semiconductor manufacturing equipment; and exhaust passage members for exhausting air in said housing to outside the clean room, characterized in that:

a separation and enclosure member is provided to isolate the housing from an atmosphere of the clean room by enclosing said housing;

an air introducing passage member is provided so as to introduce air outside the clean room into a space between the separation and enclosure member and the housing, the air introducing passage member being provided with a heat insulating material; and a heat insulating material is provided to the separation and enclosure member, thereby preventing heat from being released from the interior of the separation and enclosure member to the air inside the clean room.

According to the above-mentioned invention, since a space between the housing and the semiconductor manufacturing equipment is rendered to be a hermetically sealed space and the air introducing passage member is connected to the housing so as to take air outside the clean room into the hermetically sealed space, the cooling of the semiconductor manufacturing equipment can be performed without using the air in the clean room. Accordingly, diffusion of heat from the semiconductor manufacturing equipment to the clean room can be reduced.

In the above-mentioned invention, the housing, the separation and enclosure member and/or the exhaust passage members may have a heat reflection film, which does not generate a gaseous contaminant. Accordingly, diffusion of heat from the housing, the separation and enclosure member and/or the exhaust passage member to the clean room can be reduced without contaminating the air inside the clean room.

Additionally, the clean room can be prevented from being contaminated by sealing the housing and the separation and enclosure member by a seal material, which does not generate a gaseous contaminant. Further, the clean room can be prevented from being contaminated by forming the heat insulating material by a material, which does not generate a gaseous contaminant. The heat insulating material may be formed of a plastic foam. Alternatively, the heat insulating material may be covered and sealed by a sheet material, which does not generate a gaseous contaminant. In this case, the sheet material may be formed by a metal plate and a metal panel may be formed by the metal plate and the heat insulating material.

Additionally, there is provided according to another aspect of the present invention a semiconductor manufacturing apparatus arranged in a clean room and generating heat when a predetermined process is applied to an object to be processed, the semiconductor manufacturing apparatus comprising:

a processing part applying the predetermined process to the object to be processed;

a housing covering the processing part and configured to be capable of introducing air inside said clean room into an interior thereof; and a first exhaust passage member for exhausting air in the housing to outside the clean room, characterized in that:

release of heat from the housing to the clean room is prevented by providing a heat insulating material to the housing.

According to the above-mentioned invention, diffusion of heat from the semiconductor manufacturing equipment to the clean room can be reduced by the heat insulating material provided to the housing. Additionally, if the heat insulating material is provided also to the exhaust passage members, the diffusion of heat to the clean room can be further reduced.

Further, a carry-out chamber may be provided so as to accommodate the object to be processed carried out of the processing part, and a second exhaust passage member may be further provided so as to exhaust air in the carry-out chamber to outside the clean room. The carry-out chamber may be provided with a fan configured to introduce the air inside the clean room and a filter filtering the air passing through the fan. Additionally, the carry-out chamber may be defined by the housing, and the carry-out chamber may be isolated from a space in which the processing part is accommodated by a separation member.

Additionally, there is provided according to another aspect of the present invention a semiconductor manufacturing apparatus arranged in a clean room and generating heat when a predetermined process is applied to an object to be processed, the semiconductor manufacturing apparatus comprising:

a processing part applying the predetermined process to the object to be processed;

a carry-out chamber which accommodates the object to be processed carried out off said processing part; and a housing configured to cover the processing part and the carry-out chamber, characterized in that the semiconductor manufacturing apparatus further comprising:

a first exhaust passage member for exhausting air into the vicinity of the processing part to outside the clean room;

a second exhaust passage member for exhausting air into the vicinity of the carry-out chamber to outside the clean room;

an air introducing passage member introducing the air inside the clean room into the vicinity of the processing part;

air introducing means for introducing the air inside the clean room into the vicinity of the carry-out chamber; and heat insulating materials provided to the housing and the air introducing passage member.

According to the above-mentioned invention, the processing part is cooled by using the air outside the clean room, and the air used for cooling the processing part is exhausted to outside the clean room. Accordingly, diffusion of heat from the processing part to the clean room is prevented. Additionally, the air in the clean room is not contaminated by the air in the vicinity of the processing part. Further, since the heat insulating material is provided to the hosing, which covers the processing part, heat of the processing part is prevented from diffusing to the clean room. In this case, the diffusion of heat from the processing part to the clean room can be further reduced by providing heat insulating materials to the first exhaust passage member and the second exhaust passage member.

Additionally, there is provided a further aspect of the present invention a method for manufacturing a semiconductor device by using a semiconductor manufacturing apparatus comprising:

a processing part applying the predetermined process to the object to be processed;

a carry-out chamber which accommodates the object to be processed carried out of the processing part;

a housing configured to cover the processing part and the carry-out chamber;

a first exhaust passage member for exhausting air in the vicinity of the processing part to outside the clean room;

a second exhaust passage member for exhausting air in the vicinity of the carry-out chamber to outside the clean room;

an air introducing passage member introducing the air inside the clean room into the vicinity of the processing part;

air introducing means for introducing the air inside the clean room into the vicinity of the carry-out chamber; and a heat insulating materials provided to the housing and the air introducing passage member, characterized by the steps of:

introducing air outside the clean room into a surrounding area of the processing part through the air introducing passage member and exhausting the air to outside the clean room through the first exhaust passage member; and introducing air inside the clean room into the vicinity of the carry-out chamber through the air introducing means and exhausting the air to outside the clean room through the second exhaust passage member.

According to the above-mentioned invention, the processing part is cooled by using the air outside the clean room, and the air used for cooling the processing part is exhausted to outside the clean room. Accordingly, diffusion of heat from the processing part to the clean room is prevented. Additionally, the air in the clean room is not contaminated by the air in the vicinity of the processing part.

Other objects, features and advantages of the present invention will become more apparent from the following detailed description when read in conjunction with the accompanying drawings.

BRIEF DESCRIPTION OF THE DRAWINGS

FIG. 8 is an illustration for explaining a result of experiments performed on the semiconductor manufacturing facility according to the present invention.

FIG. 9 is an illustration for explaining a calculation of an amount of energy used in a clean room.

FIG. 11 is an illustration for explaining a calculation of an amount of energy used in a clean room.

BEST MODE FOR CARRYING OUT THE INVENTION

A description will be given below, with reference to FIG. 3 and FIG. 4 of a semiconductor manufacturing facility according to the present invention.

Figure 1:
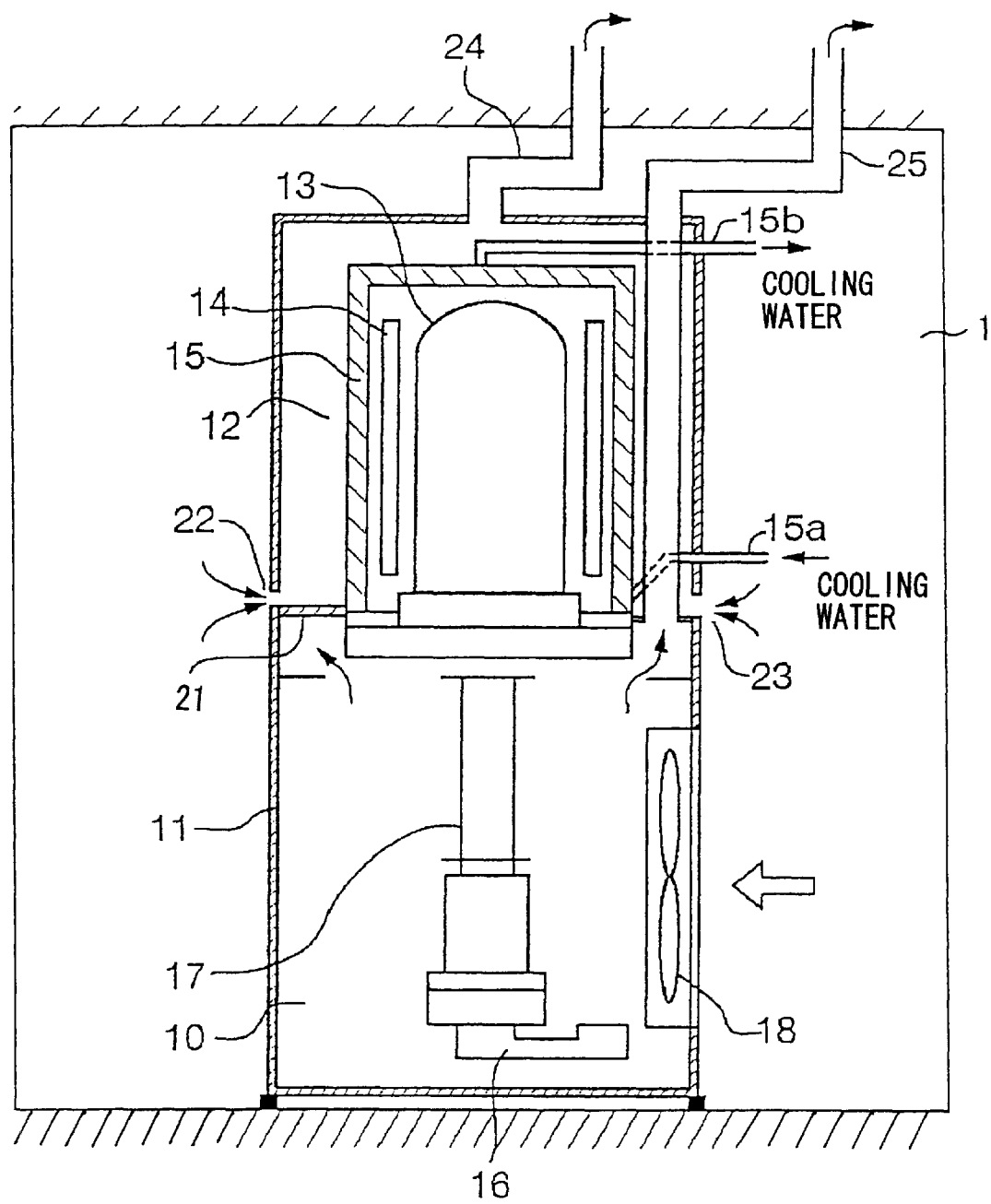
FIG. 1 is a cross-sectional view of a conventional semiconductor manufacturing facility.
Figure 3:
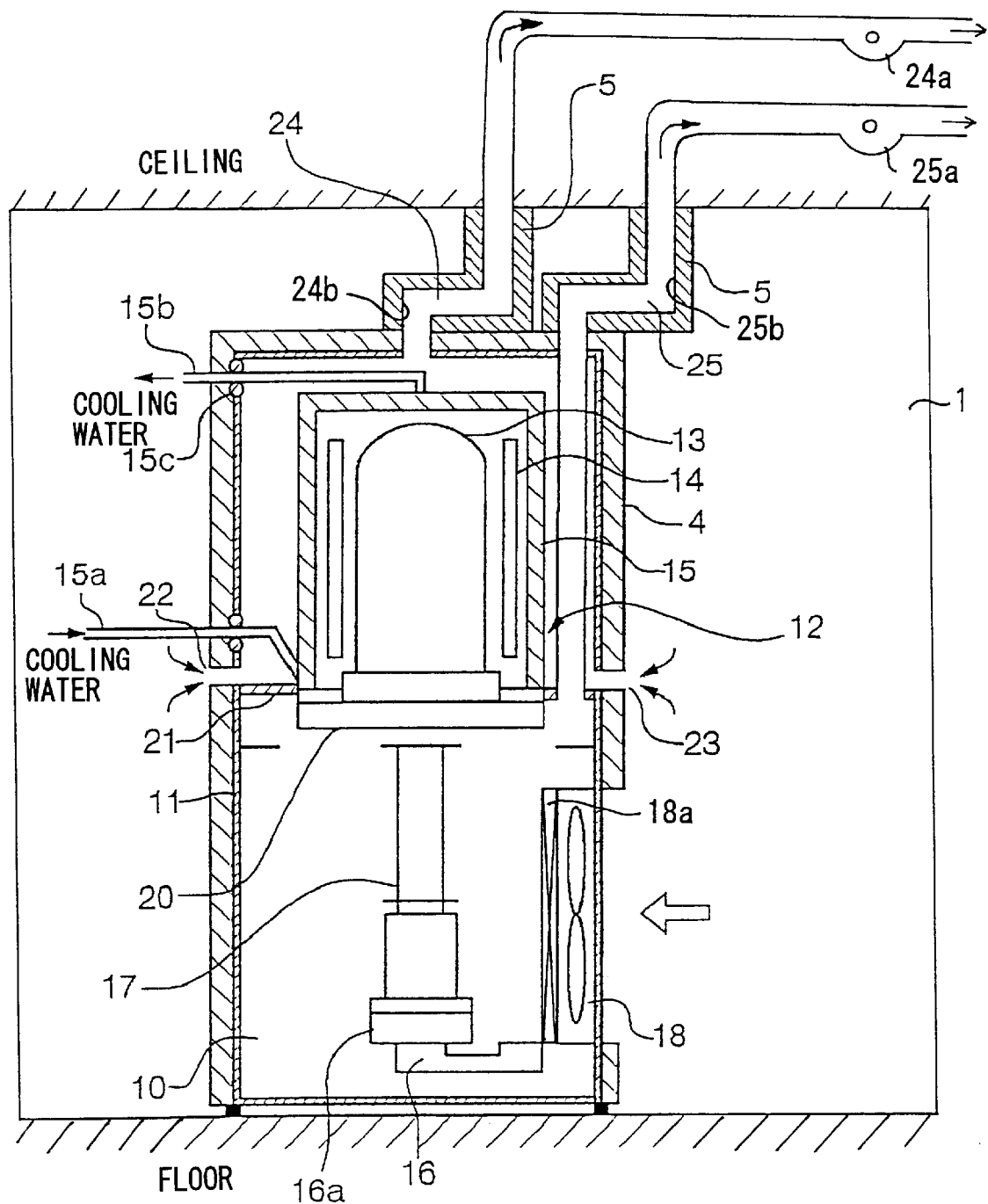
FIG. 3 is a cross-sectional view of a semiconductor manufacturing facility according to a first embodiment of the present embodiment.

FIG. 3 shows the semiconductor manufacturing facility according to the first embodiment of the present invention. In the present embodiment, a vertical heat treatment apparatus is used as the semiconductor manufacturing equipment. As for an apparatus which generates heat when a semiconductor circuit is formed, besides the vertical heat treatment apparatus, there are a resist applying and developing apparatus, a film deposition apparatus of an individual wafer processing basis type, an etching apparatus, a cleaning apparatus and a plating process apparatus. Additionally, the semiconductor manufacturing equipment includes, as an auxiliary machine of the semiconductor manufacturing apparatus, a pump, a chiller unit, an exhaust gas processing apparatus (a harm eliminating apparatus), a power supply unit, etc. It should be noted that, in FIG. 3, parts that are the same as the parts shown in FIG. 1 are given the same reference numerals.

In FIG. 3, the semiconductor manufacturing apparatus is installed in a clean room 1, and has a housing 11 formed by steel panels. A heating furnace 12 is provided on an upper side of the housing which heating furnace is a processing part constituting a main body of the semiconductor manufacturing apparatus. The heating furnace 12 comprises a cylindrical quartz rube 13, which is an reaction tube having an open lower end, a heater 14 arranged to surround the quartz tube 13 and a heat insulating material 15 provided to surround the heater 14. Cooling water is supplied through an inlet pipe 15a, and exits from a outlet pipe 15b. A seal material 15c is provided between the housing 11 and each of the inlet pipe 15a and the outlet pipe 15b so as to prevent heat transfer between the housing 11. A lower side of the housing 11 constitutes a wafer loader chamber 10 as a carry-out chamber. Additionally, an elevator 16 and a support tool 17 constitute a transfer part, and the support tool 16, on which wafers are placed, is moved upward by the elevator 16 and is carried in the quartz tube 13, and the processed wafers are carried out of the heating furnace 12 by the support tool 17 being moved downward by the elevator 16. It should be noted that a lid 16a provided to the elevator 16 is for closing the lower end opening of the quartz tube 13.

A horizontal separation board 21 is provided between an upper portion and a lower portion of the housing 11, and a support part 20 is provided in the center of the separation boar 21. The lower end of the heating furnace 12 is supported on the support part 20, and the separation board 21 separates (zones) a space outside the heating furnace 12 from the wafer loader chamber 10. Air intake ports 22 and 23 are formed in the vicinity of the separation board 21 in the upper portion of the housing 11. Additionally, a first exhaust duct 24 is connected to an upper surface of the housing 11, the first exhaust duct corresponding to a first exhaust member to exhaust air in an upper area of the separation board 21. Further, a second exhaust duct 25, which corresponds to a second exhaust member, is inserted from the upper surface of the housing 11, and the lower end thereof opens to the wafer loader chamber 10 through the separation board 21. Accordingly, the air in the wafer loader chamber 10 is exhausted through the second exhaust duct 25. The first and second exhaust ducts 24 and 25 are raised to the ceiling of the clean room 1, and are connected to an exhaust line of the plant through the ceiling part. The first and second exhaust ducts 24 and 25 are provided with exhaust fans 24a and 25a, respectively, as exhaust means. It should be noted that the air intake ports 22 and 23 are not necessarily provided, and may be an air gap through which air can flow to the upper portion of the housing 11.

In the present embodiment, the first exhaust duct 24 and the second exhaust duct 25 are provided separately from each other. This is to prevent air exhausted from the first exhaust duct 24 from counter-flowing to the wafer loader chamber 10 through the second exhaust duct 25. That is, the air exhausted from the first exhaust duct 24 contains gas or substance generated in the process, and there are many cases in which such air is harmful to wafers before being processed. Instead of separately providing the fist exhaust duct 24 and the second exhaust duct 25, a reverse flow preventing mechanism may be provided to the second exhaust duct so as to connect the first exhaust duct 24 and the second exhaust duct 25 to the same duct and lead to outside the clean room 1. Additionally, if a connecting part between the first exhaust duct 24 and the second exhaust duct 25 is located sufficiently remote from the heating furnace 12, the first exhaust duct 24 and the second exhaust duct 25 can be integrated into the same duct.

The diameter of each of the exhaust ducts 24 and 25 is preferably large, and, for example, a metal pipe having a diameter of 4 inches may be used. Additionally, a stainless steal pipe or a pipe produced by a spirally wound zinc plated plate may be used. A for a material of the exhaust ducts 24 and 25, a plastic such as polyvinyl chloride may be used as a material of the exhaust ducts 24 and 25, or a duct formed by a composite material, which is a resin impregnated glass cloth, may be used. It should be noted that a filter 18a is provided on a front surface of the fan 18 so as to remove dust from the air in the wafer leader chamber 10. Additionally, although the fan 18 is illustrated in the figure as a fan to intake outside air, a gap is provided, in practice, between the fan 18 and a side surface of the housing 11 so as to circulate air in the wafer loader chamber 10 through a circulation passage (not shown in the figure) formed on the floor of the wafer loader chamber 10, and the air in the clean room 1 flows into the wafer loader chamber 10 though an opening of the housing 11.

A heat insulating material 4 is mounted to the outer surface of the housing 11. The heat insulating material 4 is formed in a panel shape, and is mounted to the outer surface of the housing 11. The heat insulating material 4 thermally insulates the housing 11, and prevents heat in the housing 11 from being released to outside the housing. The heat insulating material 4 may be integrally mounted to the housing 11 beforehand, or may be mounted to the housing 11 of the conventional vertical heat treatment apparatus afterwards.

Figure 4:
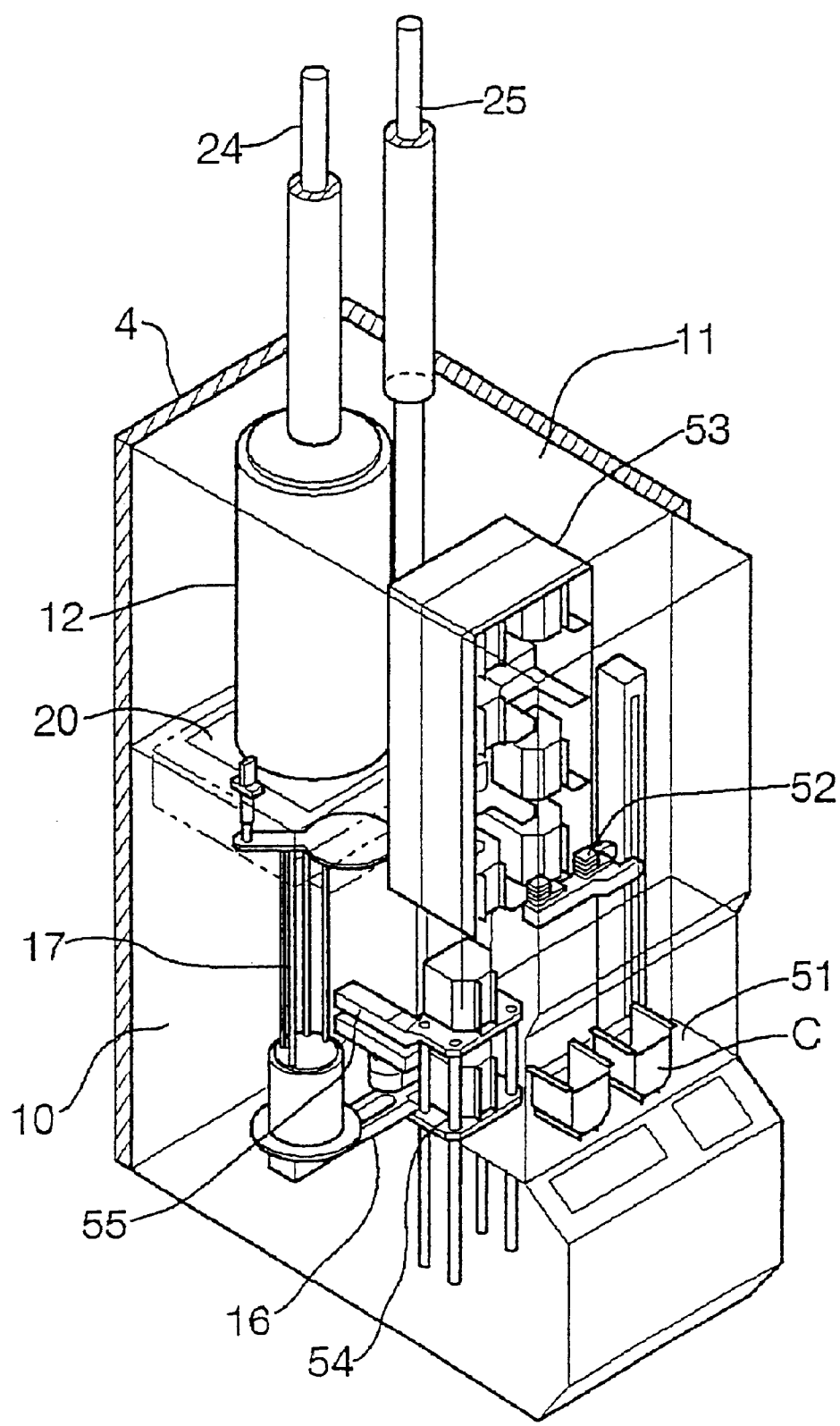
FIG. 4 is a perspective view of the semiconductor manufacturing facility according to the first embodiment of the present embodiment.

FIG. 4 is a perspective view showing an entire structure of the vertical heat treatment apparatus used in the present embodiment including a carrier inlet and outlet part. In FIG. 4, a carrier C accommodating wafers is carried in the carrier inlet and outlet part 51, and is transported to an exchange stage 54 after being temporarily stored in, for example, a carrier stocker 53 by a carrier transportation mechanism 52. Thereafter, the wafers are taken out of the carrier C on the exchange stage 54 by a wafer transfer mechanism 55, and are transferred to the wafer boat 17.

In FIG. 4, the heat insulating material 4 is illustrated on the right side surface and a back surface of the housing 11 viewed from the carrier inlet and outlet part 51 for the sake of convenience. In the present embodiment, the heat insulating material 4 is provided on the upper surface and side surfaces of the housing 11 in a portion inside of an area where the carrier transportation mechanism 52 is provided. An area to be provided with the heat insulating material 4 must be determined in consideration of heat being emitted to the wafer loader chamber 10 from the lower end opening of the heating furnace 12 during loading and unloading operation o the wafers as well as an influence of the heat from the outer surface of the heating furnace 12. Accordingly, it is preferable to provide the heat insulating material 4 to the upper surface and the side surfaces of the housing 11 in the area from the wafer leader chamber 10 to further inside.

Further, a sheet-like heat insulating material 5 is wound on the outer surfaces of the exhaust ducts 24 and 25. An are where the heat insulating material 5 is provided is a part brought into contact with the air in the clean room 1, which is, in this case, an area from the upper surface of the housing 11 to the ceiling of the clean room 1. It should be noted that the configuration of the exhaust ducts 24 and 25 do not match each other between FIG. 3 and FIG. 4 for the sake of convenience of illustration. Additionally, instead of providing the exhaust ducts 24 and 25 in the go ceiling, the exhaust ducts 24 and 25 may be extended downward toward the floor and extended under the floor.

If the exhaust ducts are made of plastics, it is preferable to provide heat reflection films 24b and 25b to inner surfaces of the exhaust ducts 24 and 25, respectively, and by doing so, a ratio of heat of the air passing thorough the exhaust ducts 24 and 25 emitted by heat transfer and heart radiation t outside is reduced. Here, the heat reflection film means a film, which reflects a heat by radiation. It should be noted that the heat reflection film may be provided even if the exhaust ducts 24 and 25 are made of metal. Further, the heat reflection film may be provided to the housing 11. An area where the heat reflection film is provided may be either the inner side or the outer side of the housing 11, but the inner side is particularly preferable.

The heat insulating material used in the present invention is formed to conform to the present invention a material which reduces movement of a heat due to heat conduction by being inserted between a high-temperature an a low-temperature part. As for an example of the heat insulating material, there is a panel (vacuum insulating material) in which a vacuum is formed or a foam material constituted by fibers or fine foam. In the semiconductor manufacturing equipment of the present invention, it is preferable to use an inorganic heat insulating material when a surface being brought into contact with the air in the clean room 1 exceeds 80° C. On the other hand, if below 80° C., an organic heat insulating material is preferably used. A specific example of the heat insulating material will be described later.

A description will now be given of action and effects of the above-mentioned embodiment. The air in the clean room 1 flows from a filter (not sown in the figure) provided in the ceiling toward the floor as a downward flow, and returns to the filter through a circulation passage (not shown in the figure) by suctioned into under the floor, and the temperature of the air is adjusted by a dry coil (flow passage of a coolant), which is a cooling facility, to a predetermined temperature of, for example, about 23° C. in the middle of the circulation passage. The air in the clean room 1 is supplied to a space between the heating furnace 12 and the housing 11 by being suctioned by an exhaust fan (not shown in the figure) provided to the exhaust duct 24 through the air intake ports 22 and 23, and is exhausted to outside the clean room 1 by an exhaust fan 24a provided to the exhaust duct 24. At this time, the heat released emitted from inside the heating furnace 12 to outside is taken to outside the clean room 1 by the air. Additionally, the air in the clean room 1 is suctioned into the wafer loader chamber 10 by the fan 18, and is exhausted to outside the clean room 1 by a fan 25a provided to the exhaust duct 25. The heat emitted from the heating furnace to the wafer loader chamber 10 is taken by the air to outside the clean room 1.

A part of the heat of the air flowing in the exhaust ducts 24 and 25 tends to get out by transferring the walls of the exhaust ducts 24 and 25, but the transfer of heat is interrupted by the heat insulating material 5 provided on the outer surfaces of the exhaust ducts 24 and 25 and is exhausted to outside the clean room 1 through the exhaust ducts 24 and 25 together with the air. Additionally, the heat transferred from the heating furnace 12 to the air in the housing 11 and the heat radiated from the heating furnace 12 tends to get out by transferring the housing 11, but the heat is exhausted to outside the clean room 1 through the exhaust ducts 24 and 25 together with the air since the heat insulating material 4 is provided to the outer surface of the housing 11.

Accordingly, an amount of heat emitted to inside the clean room 1 is reduced, thereby saving energy for decreasing the temperature of the air in the clean room 1 such as a power of the cooling facility including a delivery pump of a coolant flowing through a dry coil. Additionally, since it is possible to reduce an amount of circulated air, a power of the circulation fan can also be saved. Since the energy in the conventional apparatus is considerably large, the above-mentioned embodiment is very much effective.

In the above-mentioned embodiment, although the heat insulating material 4 (5) is provided to the outer surface of the housing (exhaust ducts 24 and 25), the heat insulating material may be provided to an inner surface or both the outer and inner surfaces. Additionally, the housing or the exhaust ducts 24 and 25 itself may be formed of a heat insulating material. Additionally, as mentioned above, the vacuum insulating material may be used as the heat insulating material.

Figure 5:
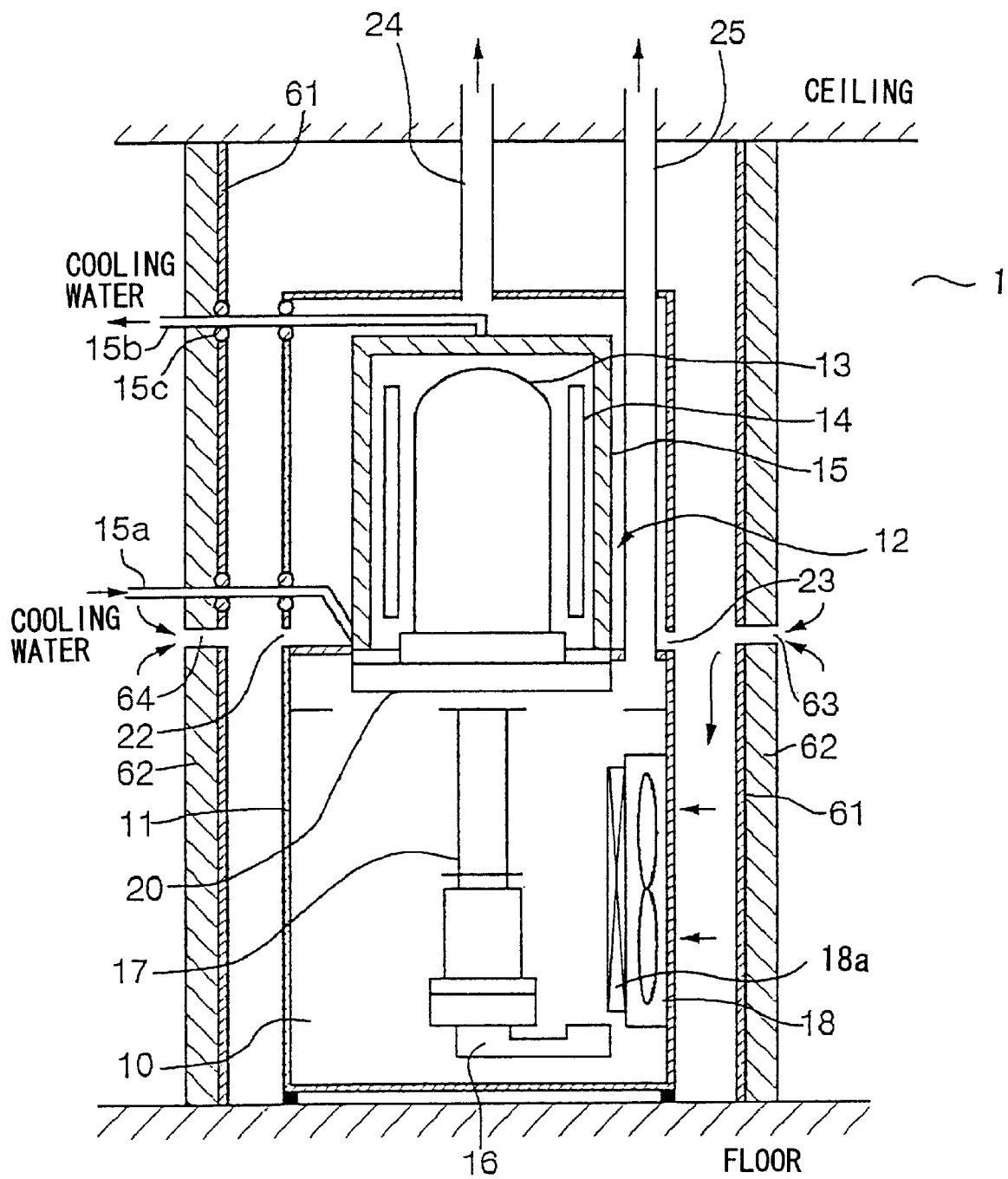
FIG. 5 is a cross-sectional view of a semiconductor manufacturing facility according to a second embodiment of the present embodiment.

FIG. 5 shows a semiconductor manufacturing facility according to a second embodiment of the present invention. In FIG. 5, parts that are the same as the parts shown in FIG. 3 are given the same reference numerals, and descriptions thereof will be omitted. In the present embodiment, the heat insulating material is not provided to the housing 11 and the exhaust ducts 24 and 25, however, the entire vertical heat treatment apparatus is enclosed by a separation and enclosure member 61 which is formed of a metal panel and a heat insulating material 62 is provided to an outer surface of the separation and enclosure member 61. Air intake parts 63 and 64 are formed in the separation and enclosure member 61 and the heat insulating material 62, and the air in the clean room 1 is introduced into a space (the side of the heat treatment apparatus with respect to the separation and enclosure member 61) enclosed by the separation and enclosure member 61. The separation and enclosure member 61 is configured to compart the clean room 1 from the floor to the ceiling at a position apart from the housing by a distance sufficient for a worker to perform a maintenance work such as a position several 10 cm apart from the housing 11. Such a structure is effective for a case in which the present invention is applied to a vertical heat treatment apparatus, which has already been installed.

In the present embodiment, the air inside the clean room 1 enters inside the separation and enclosure member 61 through the air intake ports 63 and 64, and consequently enters the housing 11 through the air intake ports 23 and 24 of the housing 11, and exits outside the clean room 1 via the exhaust ducts 24 and 25. The heat emitted from the heating furnace 12 is removed by the air to outside the clean room 1. In this case, a part of the heat emitted from the heating furnace 12 is released outside the housing 11 and the exhaust ducts 24 and 25, that is, inside the separation and enclosure member 61. However, since the heat insulating member 62 is provided to the separation and enclosure member 61, the heat is rarely released to the clean room 1 (outside the separation and enclosure member 61). It should be noted that the heat insulating material 5 may be provided to the exhaust ducts 24 and 25 as is in the embodiment shown in FIG. 3.

Figure 6:
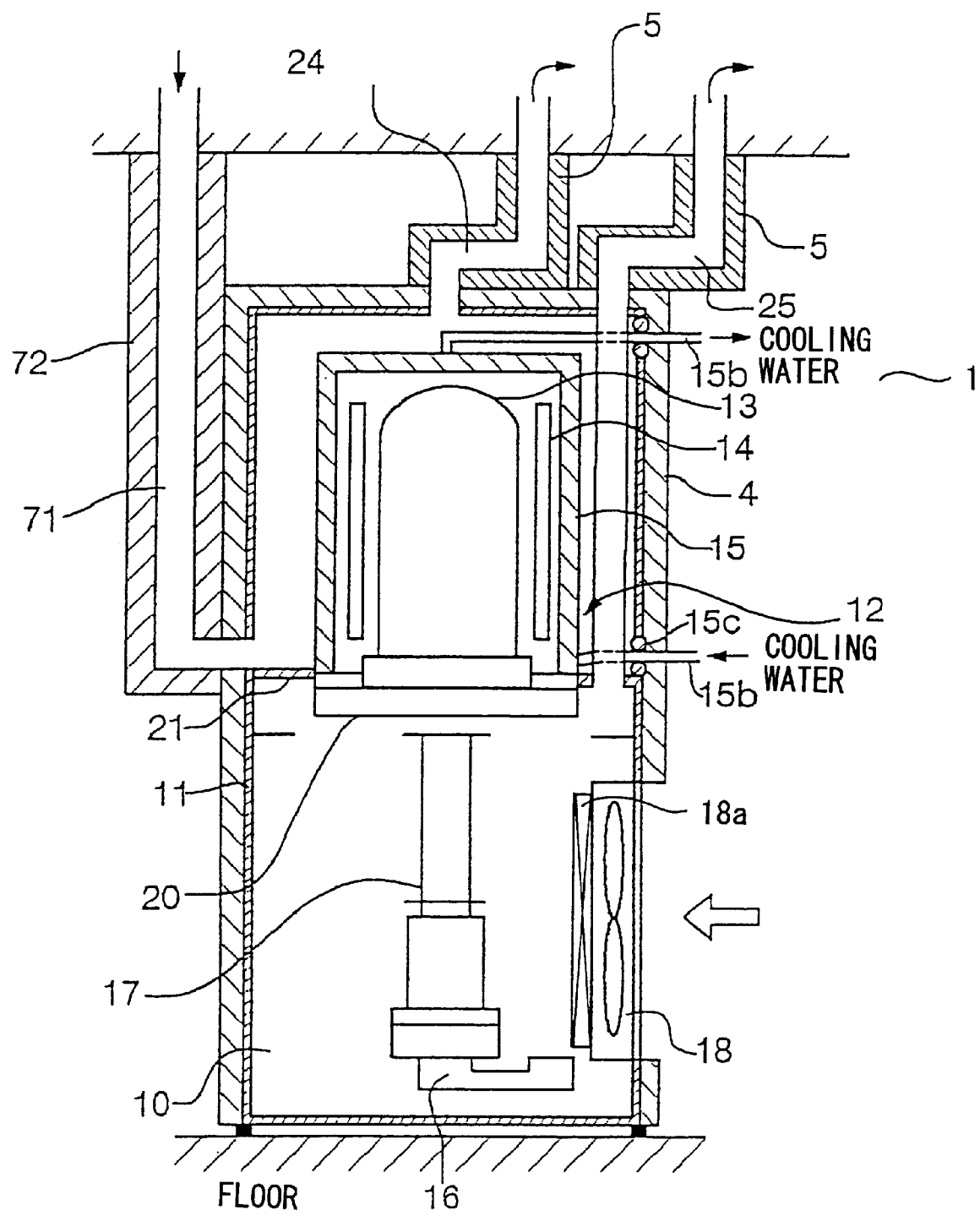
FIG. 6 is a cross-sectional view of a semiconductor manufacturing facility according to a third embodiment of the present embodiment.

FIG. 6 shows a semiconductor manufacturing facility according to a third embodiment of the present invention. In FIG. 6, parts that are the same as the part shown in FIG. 3 are given the same reference numerals, and descriptions thereof will be omitted. In the present embodiment, as shown in the facility shown in FIG. 3, an air introducing duct 71 is connected to the potion above the separation board 21 which air introducing duct being an air introducing passage member arranged from the ceiling of the clean room 1. Outside air being subjected to a minimum necessary process is introduced into a space between the housing 11 and the heating furnace 12 through the duct 71, and the air is exhausted via the exhaust ducts 24 and 25. Additionally a heat insulating material 72 is provided in the portion under the ceiling of the clean room 1, so that heat transfer between the air passing therethrough and the clean room 1 is suppressed. In this case, the portion above the separation board 21 is rendered to be a hermetically sealed space, and only air from the air introducing duct 71 flows into the hosing 11.

The above-mentioned minimum necessarily processed outside air means air which is subjected to removal of dust first and then subjected to a heat exchange by a heat pipe or the like with an exhaust air of the clean room 1 with respect to temperature and humidity. Thereby, the air is cooled in a period when a temperature of outside air is high, and is heated when the temperature of outside air is low. Accordingly, if the air outside the clean room 1 is used, an amount of energy consumption can be reduced than in a case in which the circulating air in the clean room 1 is used.

On the other hand, in a case in which the conventional semiconductor manufacturing equipment is unchanged and the conventional air cooling method is used, there may be dew formation generated in the periphery of the apparatus. That is, if air of which temperature and humidity is not controlled is used for cooling of the semiconductor manufacturing equipment, there is a possibility of dew formation occurring on either an inner surface of the housing or a surface on the side of the clean room 1 clean due to the 23° C. air of the clean room 1. That is, during a hot and humid period, if the hot and humid air for cooling is supplied to the equipment, there is a possibility of dew formation since the temperature of the housing surface is about 23° C. However, in the present invention, dew formation never occurs in the housing on the side of the equipment due to the effect of the heat insulating material 4 mounted on the housing 11.

On the other hand, during a period of low outside temperature, if a cold air of about several degrees (° C.) is introduced into the housing, it is possible that dew formation occurs in the housing on the side of the clean room 1. However, in apparatus of the present invention, since the temperature of the surface of the partition facing the clean room 1 is not so low as generating dew formation, there is no dew formation occurring in the housing on the side of the clean room 1. Additionally, even a humid outside air can be used to perform a temperature control by a heat exchange with the exhaust air of the clean room 1, and, thereby, the humidity can be decreased.

It should be noted that the outside air to be delivered to the air introducing duct 71 may be processed, for example, by a HEPA filter, and the air introducing duct 71 may be connected to the wafer loader chamber 10 by branching in the middle thereof so as to deliver the outside air to the wafer loader chamber 10. In this case, the wafer loader chamber 10 may be hermetically sealed so that the air in the clean room 1 is not substantially taken into the wafer loader chamber 10. It should be noted that the hermetic seal in this case does not mean a complete shutoff of an air flow but a slight degree of air leakage is allowed.

Figure 7:
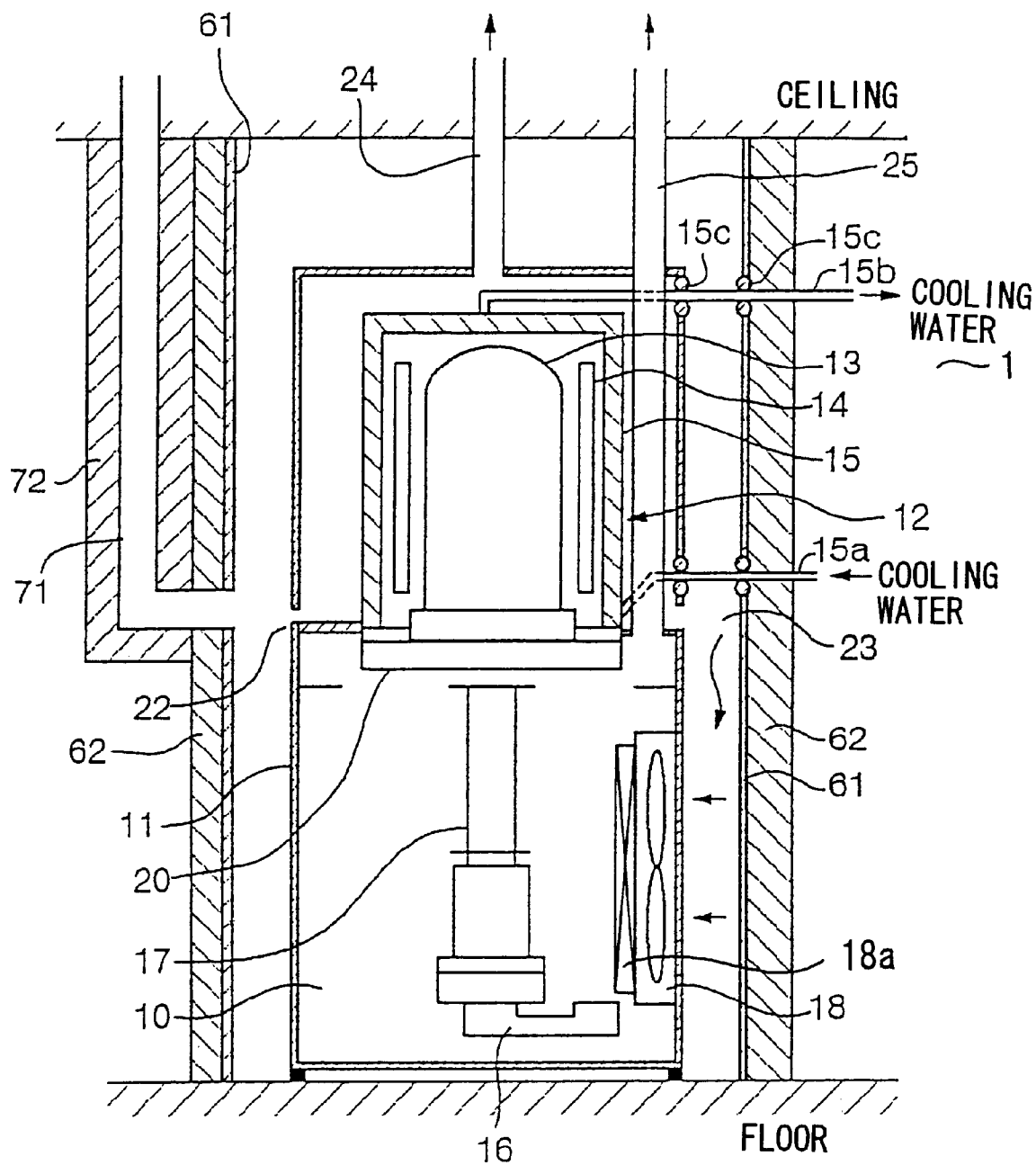
FIG. 7 is a cross-sectional view of a semiconductor manufacturing facility according to a fourth embodiment of the present embodiment.

FIG. 7 shows a semiconductor manufacturing facility according to a fourth embodiment of the present invention. In FIG. 7, parts that are the same as the parts shown in FIG. 5 and FIG. 6 are given the same reference numerals, and descriptions thereof will be omitted. In the present embodiment, an air introducing duct as shown in FIG. 6 is applied to the facility shown in FIG. 5. That is, a space enclosed by the separation and enclosure member 61 is rendered to be a hermetically sealed space, and the air outside the clean room 1 is introduced into inside the separation and enclosure member 61 by connecting the air introducing duct 71 provided with a heat insulating material 72 to the separation and enclosure member 61. In such a structure, since the heat removal is performed by using the air outside the clean room 1, an amount of energy consumption can be reduced than a case in which the circulating air in the clean room 1 is used. It should be noted that the hermetically sealed space means a space to which substantially no air enters inside the separation and enclosure member 61 except for the portion of the air introducing duct 71.

As for seal material for forming the above-mentioned hermetically sealed space, it is necessary to select a material, which does not generate a gaseous contaminant such as an organic material described later. That is, it is preferable that an organic material such as cyclohexane is not detected at 80° C. when the material is analyzed according to a method of measurement of an amount of organic material mentioned later.

A description will now be given of the heat insulating materials 4, 5, 62 and 72 used in the present invention. As for an inorganic heat insulating material, it is suitable to use an inorganic fiber heat insulating material such as glass wool, rock wool or quartz woo, a porous ceramic insulating material such as diatomite or alumina and a bead-like inorganic porous material such as pearlite or silastic balloon. Since these inorganic heat insulating materials may generate dust or gaseous contaminants, it is necessary to cover them in their entirety by a metal sheet or the like. Alternatively, a sandwich panel may be formed by two steel plates, and an opening may be sealed by an aluminum tape or the like. Additionally it is preferable to seal the opening by a plastic sheet or a sealant so that a heat bridge is not formed. The heat bridge is a portion through which heat can be transferred as a bridge (connecting point between metal parts) over a river (heat insulating material) only at that part. If there is such a heat bridge, a heat transferred through either a front metal sheet or a back metal sheet passes therethrough, and thereby, the effect of the heat insulating material is cancelled. However, heat transfer between the metal sheets is interrupted by a plastic being interposed between the metal sheets of both sides. As for such as seal material, it is preferable to use a seal material described in Japanese Laid-Open Patent Application NO.9-95661. In order to directly insulate the housing, a bead-like inorganic foam material may be filled in a hollow panel formed by welding or adhesion through an opening and the opening may be sealed by welding after the foam material is filled.

Since the glass wool, rock wool or the like generates various kinds of inorganic gaseous contaminants, those materials must be covered by a metal sheet and be used after confirming that the gaseous contaminants are not detected by a test method described later.

A heat insulating material is already mounted on the surface of the main body of the semiconductor manufacturing equipment, which generates heat during use, and, thereby, the temperature at the surface does not exceed 80° C. In such a case, an organic heat insulating material can be used. As for the organic heat insulating material, there are plastic foam materials such as polyethylene foam, polystyrene foam, polyurethane foam, etc. Generally, the plastic foam materials generate gaseous contaminants.

Especially, hydrocarbon having a molecular weight of 200 to 400, 2 basic fatty acid diester, organic phosphoric ester, amine compounds, aromatic sulfone amide have a tendency to be adsorbed onto a silicon wafer. Among those compounds, an amount of adsorption is reduced if the molecular weight is smaller than 200. The reason for this is considered that a rate of removal is larger than a rate of adsorption onto the wafer. Additionally, in a compound having a molecular weight exceeding 400, an amount of adsorption to the wafer is reduced since a rate of generation of the gaseous contaminants from the foam material is small. Further, siloxane having a molecular weight of 400 to 900 has a high adsorbability to a silicon wafer.

A first method of preventing the generation of such an organic material is to produce a plastic foam without using such an organic material. However, when the plastic foam material is produced, a filler and a plasticizer are added so as to improve formability. Further, when foaming is generated by heat melting, an antioxidant is added so as to prevent oxidation due to air in the melted state. Accordingly, if the plastic form material is produced without using those additives, there is a problem in that a predetermined strength and durability cannot obtained due to degradation of the material. Accordingly, it is necessary to use a plastic foam material, which does not generate organic contaminants, while maintaining a predetermined strength and durability.

A second method of preventing the generation of organic materials is to shutoff the organic materials to be generated by enclosing the plastic foam material by a sheet. That is, a plastic foam material is formed by using conventional additives, and the thus-foamed plastic foam material is enclosed by a film or sheet, which has a small gas-transmissivity and does not generate organic materials, and openings are sealed by a sealant or a gasket so as to shutoff the organic materials generated from the plastic foam material inside the film or sheet enclosure. A determination as to whether or not the shutoff effect is sufficient will be described later. As for such a sheet, there are a metal sheet as described with respect to the heat reflection film and a plastic film on which metal is deposited. If a heat insulating material is mounted to the separation board, and a heat reflection film is applied to the heat insulating material, both the heat reflection function and the sealing function to seal organic materials generated form the plastic foam material can be provided at the same time. In such a case, the same function can be provided by mounting the heat insulating material to the separation and enclosure member either on the side facing the semiconductor manufacturing equipment or the side facing the clean room 1.

In order to provide a heat insulation characteristic to the housing itself, a foaming urethane is filled in a hollow panel so as to form a heat insulating panel and the thus-formed heat insulating panel is used. Many raw materials of a hard urethane foam, which can be used as a heat insulating material, contain 4, 4' methylene bis(phenyliscyanate) (MDI) as a main component. Since MDI has a solidifying point of 36 to 39° C., the MDI is a solid state in a room temperature, and the solid state isocyanate is not easy to be formed as a foam material.

In order to solve such a problem, phosphoric ester is used to liquefy the isocyanate. In such a case, a low volatile phosphoric ester such as tricresyl phosfate. Conventionally, phosphoric tributyl (molecular weight 266) is mainly used. However, phosphoric tributyl cannot be used since it vaporizes when a foam material is formed and contaminates the air in the clean room 1.

On the other hand, since polyol, which reacts with MDI, is farmable, a method is used to change polyol to be flame resistant by adding phosphoric ester. Normally, toris.chloroethylephosfate (molecular weight 285) or tris.β-chloropropylphosfate (molecular weight 328) is used for such a purpose. However, these flame resistant agents may vaporizes in the foam material, and contaminate the air in the clean room 1.

In the present invention, when phosphoric ester is used, it is necessary to use phosphoric ester having a molecular weight equal to or greater than 350. For example, on the isocyanate side, tricresyl phosfate (molecular weight 368), trixylenylphosfate (molecular weight 410) or xylenyldiphenylphosfate (molecular weight 354) is used. On the polyol side, a material using tris.dichloropropylphosfate or the like is used.

In order to foam urethane, a chlorofluorocarbon foaming agent and a foam controlling agent are used, the foam controlling agent being added so as to homogenize bubbles generated by foaming. A for the foaming agent, a chlorofluorocarbon gas such as Freon 12 is conventionally used, but 142b has been used since destruction of the ozone layer was reported. However, since the amount of those chlorofluorocarbon gases is large, it has been found that they cause out-gas. Accordingly, mainly water foaming urethane is used, and silicone denaturation polyol from which siloxane having a number of silicon equal to or less than 12 is used as a foam controlling agent. Cyclic siloxine is generated from the conventional foam control agent, and if such a material is used for forming a foam material, the cyclic siloxine is released to air, which causes contamination.

Because of the above-mentioned problems, in a case of urethane, is it necessary to use after confirming that the heat insulating material does not generate gaseous contaminants by analyzing according to an analyzing method described later.

A third method of preventing the generation of organic materials is to reduce generation of gaseous organic materials with respect to the plastic foam material itself. As for such a plastic foam material, polyethylene, polystyrene or ethylenepropylene tarpolymer may be used. In this case, foaming is performed in a state in which the plastic is melted.

The fact that an amount gaseous organic materials from the plastic foam material is small is confirmed by a method described in the paragraph of an analyzing method of a plastic foam material mentioned later. In the analyzing method, a sample is heated to 150° C. so as to forcibly generate organic materials. If the amount of organic materials generated is less than 20 [μg/g sample] by this method, substantially no organic material is generated in a temperature ranging from a normal temperature to 80° C. A surface temperature of the semiconductor manufacturing equipment, which generated heat during use, is normally lower than 80° C. At this temperature, no organic material is released to the air if a plastic foam material having the above-mentioned amount of organic materials generated is used, and, thereby, the air in the clean room 1 is not contaminated by organic materials generated. Fatty acid ester having a molecular weight equal to or greater than 420 is used as a plasticizer used for producing the above-mentioned foam material. A an example, diester phthalate is used. More specifically, diisodecyl phthalate, (molecular weight 446), diundecyl phthalate (molecular weight 474), ditridecyl phthalate (molecular weight 530) or the like is used.

If a plasticizer used for the current film or sheet having a molecular weight less smaller than 400 such as dibutyl phthalate (molecular weight 278) or dioctyl phthalate (molecular weight 391) is used as a main component, the plasticizer may evaporate into the air in the clean room 1, which causes a problem of air contamination. Especially, it is preferable to not use dibutyl phthalate (molecular weight 278) which has a high volatility even a small amount. Since dioctyl phthalate (molecular weight 391) has a molecular weigh close to 400, it can be used with the above-mentioned plasticizer having a molecular weight equal to or greater than 400 as a secondary component which is less than several percent.

As for fatty group dibasic acid ester, di-2-ethylhexyl azelate (molecular weight 547) or di-2-ethylhexyl sebacate (molecular weight 427) is suitable for the present invention. Di-2-ethylhexyl adipate having a molecular weight smaller than 400 is not preferable since it evaporates into the air in the clean room, which causes air contamination.

Additionally, as for a trimellitic plasticizer suitable for the present invention, there is trimellitic acid tris-2-ethylhexyl (molecular weight 547) or trimellitic aid trioctyl (molecular weight 547).

Further, as for a polyester plasticizer suitable for the present invention, adipic acid propylene grycal or adipic acid butylenegrycol, which is a polymer of dibasic acid such as adipic acid, azelaic acid, sebacic acid or phtallic acid and glycol or glycerin, are typically used. A molecular weight of these materials is 2000 to 8000.

On the other hand, as for an epoxy plasticizer suitable for the present invention, there is epoxy fatty acid ester (molecular weight 400 to 500) or epoxydation oil (molecular weight about 1000).

As for an antioxidant, phenol compound having a molecular weight equal to or greater than 300 can be used as a main component. As for specific examples of such an antioxidant, at least one of the followings can be used. They are: stearyl-β-(3,5-di-t-butyl-4-hydroxyphenyl)propionate (molecular weight 520.9); 2,2'methylene-bis(4-methyl6-t-butylphenol) (molecular weight 340.5); 2,2'methylene-bis(4-methyl6-t-butylphenol) (molecular weight 368.54); 4,4'-butilidenbis(3-methyl-6-t-butylphenol) (molecular weight 382.6); 1,1,3-tris(2-methyl-4-hydroxy-5-t-butylphenol)butane (molecular weight 544.8)1,3,5-trimethyl-2,4,6-tris(3,5-di-t-butyl-4-hydroxybenzil)benzene (molecular weight 775.2); tetrakis[methylene-3-(3',5'-di-t-butyl-4'-hydroxyphenyl)propionate)]methane (molecular weight 1177.7); bis[3,3'-bis(4'hydroxy-3'-t-butylphenyl)butylic acid]grycol ester.

An antioxidant mainly containing, as a main ingredient, a monophenol antioxidant having a molecular weight smaller than 300 such as 2,6-di-t-butyl-P-cresol (molecular weight 220.4) evaporates and contaminates the air in the clean room 1.

On the other hand, if a limited antioxidant used for the present invention which contains, as a main ingredient, a phenol antioxidant is used, evaporation from a plastic film or a plastic sheet is substantially suppressed. Of course, the antioxidant having a molecular weight smaller than 300 does not deteriorate the effect of the present invention if it is used by mixing up to, for example, 10% as a secondary ingredient of the above-mentioned antioxidant.

Additionally, as for a specific example of the heat reflection film, there is a metal sheet such as aluminum, bronze or stainless steel alloy. Additionally, there is a film on which a metal is deposited, and, for example, a polyester film is normally used as the film. As for the metal to be deposited on the film, aluminum, bronze or stainless steel alloy may be used. Additionally, the metal may be deposited on the film by sputtering. The metal sheet or sputtered film is applied onto a surface of the separation board by an adhesive. Alternatively, the metal sheet or the sputtered film may be applied onto a surface of a heat insulating material described later, and is mounted to the separation board or a surface of the duct together with the heat insulating material.

Figure 2:
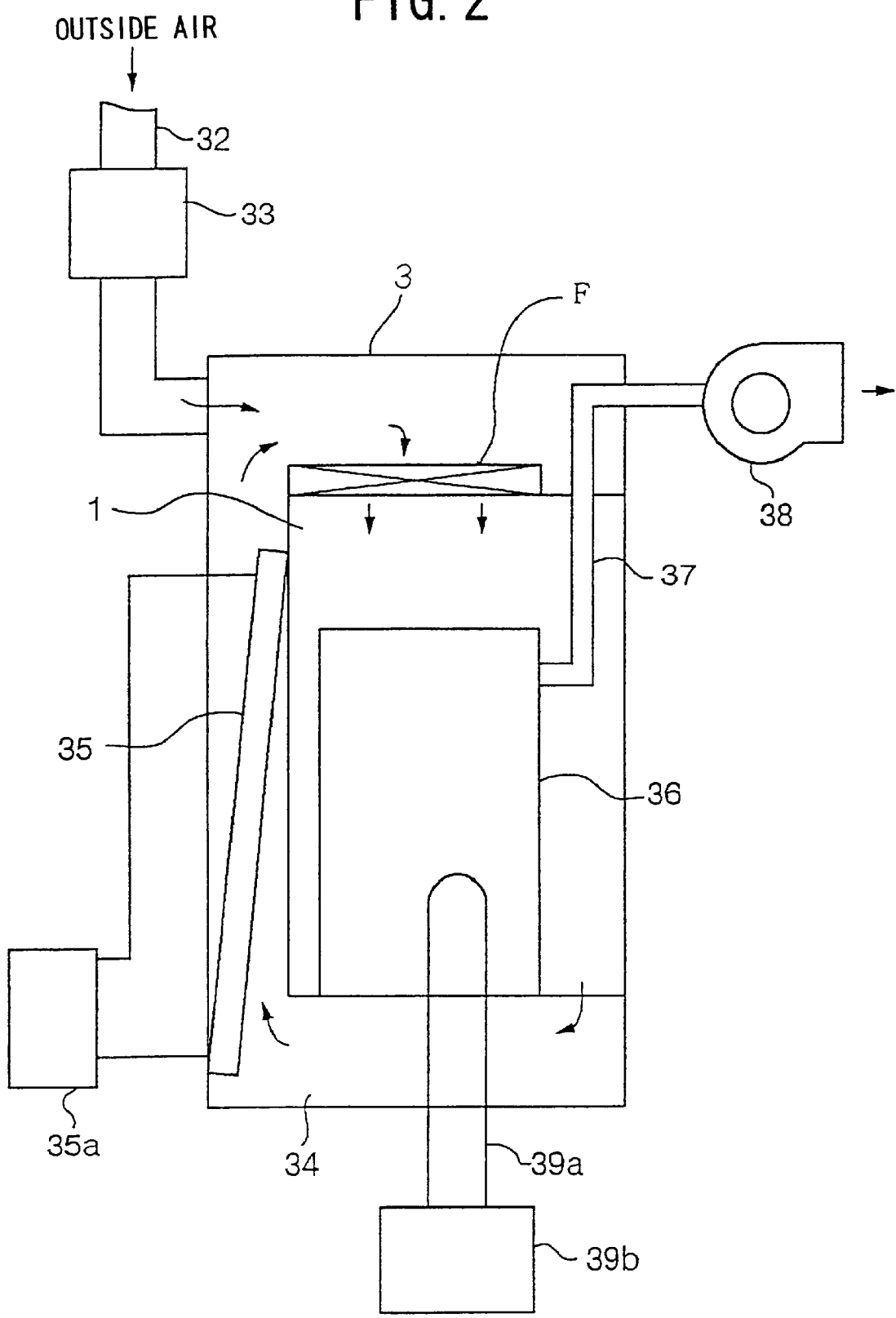
FIG. 2 is a structural diagram of an experimental apparatus for performing experiments with respect to the semiconductor manufacturing facility.

A description will now be given of a result of comparison between the vertical heat treatment apparatus provided with the heat insulating material according to the above-mentioned embodiment and the conventional apparatus provided with no heat insulating material. The comparative experiments were conducted, by using the test facility shown in FIG. 2, with respect to a power consumed by the dry coil 35 to maintain the air in the clean room at 23° C. FIG. 8 is an illustration for explaining the result of comparison. In FIG. 8, material used, exhaust conditions, and results of measurement for organic materials and inorganic materials in the clean room 1 are also indicated. The method of measurement of organic materials and the test results were as follows.

[Method of Measurement of Organic Materials in the Clean Room Air]

In order to measure an amount of organic material in the clean room air, first, a cleaned silicon (Si) wafer was exposed in the clean room 1 so as to have organic materials in the clean room 1 to adhere onto the wafer. In this case, in order to clean the Si wafer surface, a method was used to oxidize and decompose the Si wafer by using ozone gas under irradiation of off an ultraviolet beam. Since an oxidation film was formed on the surface of the wafer from which the organic materials are removed by this method, a rate of adsorption of the wafer was six times that of a wafer, which was cleaned by hydrofluoric acid. Accordingly, this method was suitable for the analysis in a case in which a concentration of organic materials in the clean room 1 was low.

Next, an apparatus used for analyzing the organic materials adhering onto the Si wafer was a silicon wafer analyzer (trade name) (hereinafter, abbreviated as SWA) manufactured by GL Science Co. The adsorbed components were removed by heating at 400° C. under helium flow, and were analyzed by introducing them into a RC/MS apparatus.

In the GC/MA apparatus equipped to the SWA used for the present invention, HP-5890A was used as the GC apparatus and HP-5971A was used as the MS apparatus. Temperature conditions were as follows.

Initial temperature 80° C. (maintain for 10 min) →temperature up 7° C./min→final temperature 300° C. (maintain for 10 min).

The analysis using the SWA was excellent with respect to a point that a substance, which is easily adsorbed by the wafer from among organic materials present in the air, can be analyzed. Additionally, an amount of adsorption to the wafer was indicated by ($pg/cm^2$) as a weight (pg) per unit area of the wafer since the analysis sensitivity was that the analysis can be made up to an order of several picograms ($10^{-12}$ g).

It should be noted that, in the measurement, a Si wafer, which was cleaned by the same cleaning and was left in a wafer pod without exposing to the clean room atmosphere, was subjected to the same analysis, and the result of the analysis was used as a blank value. An amount of organic materials adsorbed by the wafer was assumed to be a value obtained by subtracting the blank value from the analyzed value of the Si that was exposed in the clean room 1. Since the amount of organic materials adsorbed by the wafer is reduced as an amount of organic materials in the clean room is reduced, this value was used as an index which represents the amount of organic materials in the clean room.

[Method of Measurement of Inorganic Materials in the Clean Room]

In order to analyze inorganic materials in the clean room air, a method was used in which the air in the clean room 1 was passed through an inpinger filled with pure water, and dissolved inorganic materials was analyzed. Among the inorganic materials, metal elements were analyzed by the IPC/MA method, and ions were analyzed by the ICG method. Working curves were made by using each component solution of a known concentration, and an amount of collection trapping was calculated up to $10^{-9}$ (mg) by determining quantity of solution concentration of the collected samples, and further, the obtained value was divided by an amount of gas flow, and was indicated by a concentration (mg/m$^3$) per one cubic meters (m$^3$) of the clean room air.

[Method of Analyzing an Amount of Organic Materials Generated from Organic Heat Insulating Material]

The method of analyzing organic materials generated form the organic heat insulating materials used in the present invention was a method generally referred to as purge & trap gas chromatograph/mass spectrum (hereinafter abbreviated as P&T-GC/MS).

First, specimen of several tens milligrams was filled in a test tube, and heated at 80° C. for 30 minutes under the flow of helium, and organic components generated was trapped by a trap tube, which was cooled at −80° C. After completion of heating of the specimen, the trapped organic components were rapidly heated at 300° C. under the flow of helium, and were analyzed by being introduced into the GC/MS apparatus. The GC apparatus was the HP-5890A type of Hewlett-Packard Co. (hereinafter abbreviated as HP), and the HP-5970B type mass analyzer was used for the MS apparatus. The column of the GC apparatus was HP-Ultra 2 (OV-5), which has an inner diameter of 0.2 mm, a length of 25 m and a film thickness of 0.33 $\mu$m. The temperature condition of the measurement was as follows.

initial temperature 40° C.→temperature up (10° C./min.)→final temperature 300° C. (maintain for 15 min.)

The carrier gas was helium, and a split method was used for the injecting method. The sprit ratio was 1/200. The ionizing method of MS was an electron bombardment method, and detection range was 25 to 1000 m/z.

In the present invention, an amount of organic materials generated from the organic heat insulating material, which can be used alone, is 50 $\mu$g/g-specimen). If the amount of generated organic material exceeds such an amount, the material is covered by a metal and the like, and is used after being analyzed by the following out-gas measuring method for a sandwich panel or the like.

[Method of Analyzing Organic Materials Generated from Heat Insulating Material Panel]

Figure 10:
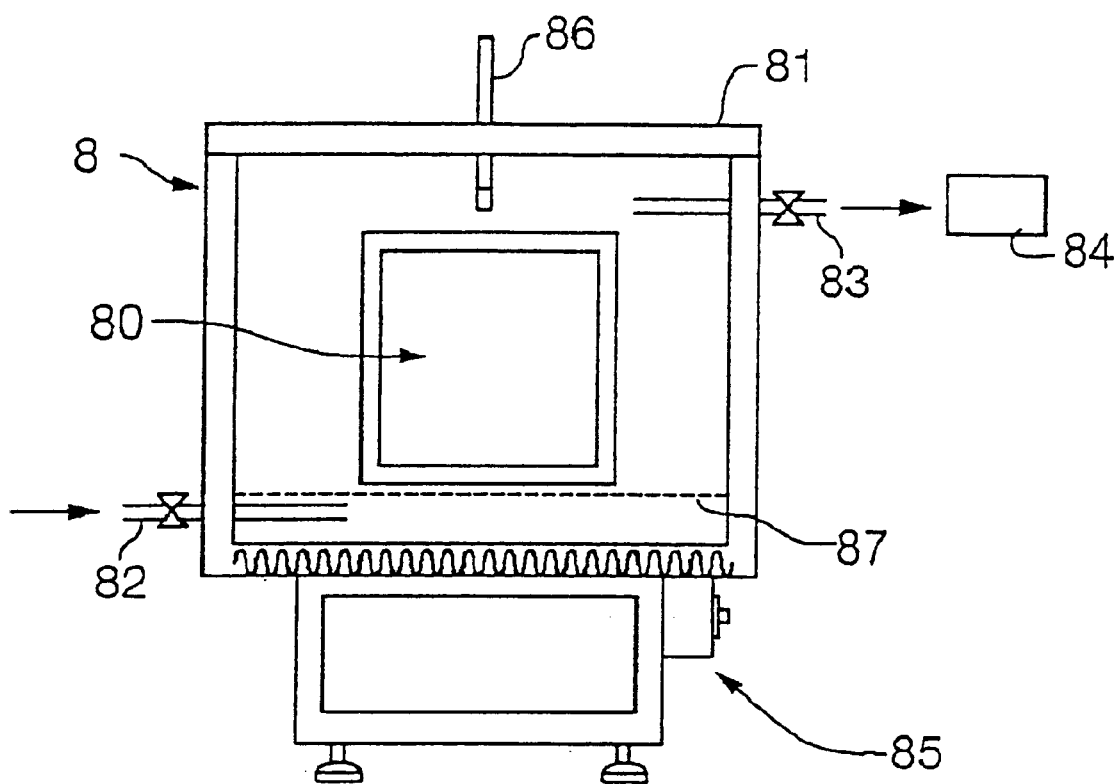
FIG. 10 is a structural diagram of an analyzer of a substance generated from an insulating material.

Measurement of an mount of organic materials generated from the heat insulating material panel was performed by using the apparatus shown in FIG. 10 as follows. First, a large hermetically sealed large container 8 for heating was prepared which container is equipped with a lid and provided with an inlet pipe and an outlet pipe so that highly purified air can be supplied. A formed panel 80 is placed in the container 8 (specifically, placed on a mesh 87) and is hermetically sealed by the lid 81. Then, highly purified air was supplied from the inlet pipe 82, and an activated carbon adsorbing tube 84, which can adsorb organic materials generated, was mounted to the outlet pipe 83. An amount of follow was adjusted to be a predetermined amount of flow while observing a flow meter provided after a sampling apparatus 84 which is the activated carbon adsorbing tube. Then, a power was supplied to a heater 85 to heat at 100° C. while measurement was taken of the temperature inside the hermetically sealed container 80. In this state, organic materials were adsorbed by the sampling apparatus 84 (activated carbon adsorbing tube) continuously for 4 hours.

The thus-obtained activated carbon was put in a predetermined amount of solvent so as to dissolve the adsorbed organic materials. The solution was then supplied to a gas chromatogram device and analyzed the ingredients. An amount of organic materials was determined by the working curve of n-hexadecane from a peak are of each peak.

[Method of Analyzing Inorganic Materials Generated form Heat Insulating Material Panel]

Experiments were performed by the same method as the measurement of organic materials by using the above-mentioned apparatus for measuring an amount of organic materials generated from the heat insulating material panel by mounting an inpinger filled with ultra pure water, instead of the activated carbon adsorbing tube, to the sampling apparatus 84. With respect to the sample collected by the inpinger, metal elements were analyzed by the IPC/MS method, and ions were analyzed by the ICG method. Working curves were made by using each component solution of a known concentration, and an amount of collection trapping was calculated up to 10$^{-9}$ (mg) by determining quantity of solution concentration of the collected samples, and the result was determined as an amount of generation per one panel.

Test number 1 in FIG. 8 is a case example of the present invention, in which parts of the housing and the exhaust duct brought in contact with the air in the clean room 12 was heat insulated by an organic foam material which does not generates gaseous contaminants. Due to the use of the heat insulating material, an amount of energy saved on the lean room 1 side was about 3800 kcal/hr. FIG. 9 is an illustration for explaining eth reason for this. It was found that an amount of energy load to the dry coil can be greatly reduced. Additionally, an increase in an amount of contaminants in the clean room air due to the used heat insulating material was not observed with respect either organic materials or inorganic materials.

Test number 2 in FIG. 8 is a case example of the present invention, in which only the housing was insulated and the exhaust duct was not insulate. Other conditions were set the same as test number 1. In this case example, although an amount of energy saved was slightly reduced, it was found that a considerable effect can be obtained.

Test number 3 in FIG. 8 is a comparative example with respect to the present invention, which is a case example of a facility in which no heat insulating material was used. It was found that the release of energy raises the temperature of the clean room 1, and the above-mentioned amount of thermal load was reached due to cooling necessary for the dry coil.

Test number 4 in FIG. 8 is a comparative example with respect to the present invention, in which case example only the exhaust duct was insulated. In this case, energy saving was achieved, but the air in the clean room 1 was contaminated due to organic ester phosphate generated from the organic foam material. As a result, an increase in the amount of ester phosphate was observed in the exposed wafer. Accordingly, it was found that use of a heat insulating material, which does not generate contaminants, is an essential requirement.

Test numbers 6 and 7 are case examples of the present invention, in which outside air subjected to a required minimum process was used as air for cooling the oxidation furnace. In the present invention, a panel was used as an inorganic heat insulating material, which panel was prepared by sandwiching glass wool between steel plates and applying a sealant (hematite YG-61 manufactured by Yokohama Rubber Co.), which does not generates organic contaminants, to openings thereof. The panel was heated by the apparatus shown in FIG. 10 at 80° C., which is close to a temperature of a periphery of the furnace. The generated contaminants were measured by the above mentioned [method of analyzing organic materials generated from heat insulating material panel] and [method of analyzing inorganic materials generated from heat insulating material panel]. As a result, an organic material or inorganic material, especially, boron from glass fiber was not detected.

A housing was formed by the above-mentioned materials, and experiments the same as the above-mentioned experiments were performed. As a result, it was able to reduce an amount energy loss due to a heat release to the clean room 1. Additionally, although the air in the clean room 1 was conventionally used for cooling, it was able to save clean room air due to the use of air, which has been subjected to a required minimum process. The saved amount corresponded to about one half of the cost for treating the clean room air. The total amount of energy saved during a hot and humid period was 256000 [kcal/day·apparatus], which was very effective energy conservation. FIG. 11 is an illustration for explaining the base of the calculation. Since the calculation was made on the assumption that the heat exchange rate is 100%, the value indicates the minimum energy saving which can be attempted.

In the present embodiment, the outside air was filtered by a prefilter, a middle filter and a HEPA (High Efficiency particle Air) filter, as the required minimum process, and the thus-filtered air was subject to the heat exchange with exhaust air form the clean room 1 by a heat pipe. Conventionally, it is not possible to use such air to cool the heating furnace due to a problem of dew formation. However, in the present embodiment, it was confirmed that dew formation was not generated either in the case of test number 6 during a period when outside air is hot and humid or the case of test number 7 during a period when outside air is cold.

Test numbers 8 and 9 in FIG. 8 are comparative example with respect to test numbers 6 and 7. In these example, the air, which has been subjected to the required minimum process, was used without using heat insulating material. As a result, in the test number 8 during a period when outside air is hot and humid, dew formation was generated on an inner side of an outside air intake duct and an inner side of the housing, which are brought in contact with the air in the clean room 1. On the other hand, in the test number 9 during a period when outside air is cold, dew formation was generated on an outer side of the outside air intake duct and the housing on the side of the clean room 1, which are brought in contact with the air in the clean room 1. According to the results, it was found that dew formation is generated if the air in the clean room 1 is not used for cooling the equipment, which generates heat, in a case in which the heat insulating material is not used.

Test number 10 in FIG. 8 is a comparative example with respect to the present invention. In this comparative example, glass wool was used as an inorganic heat insulating material and openings were not sealed. In this case, dew formation was not generated, but boron leaked through the openings and an amount of boron in the peripheral air was increased. From this, it was found that it is essential for a heat insulating material, which generates gaseous contaminants, to be covered by steel plates and apply a sealant to openings thereof so as to seal the opening.

As mentioned above, according to the present invention, diffusion of heat from the semiconductor manufacturing equipment to the clean room 1 can be reduced, and an amount of energy consumed to maintain the clean room 1 at a predetermined temperature is also reduced.

The present invention is not limited to the specifically disclosed embodiments, and variations and modifications may be made without departing from the scope of the present invention.

What is claimed is:
1. A semiconductor manufacturing facility comprising:
a clean room;
a semiconductor manufacturing equipment provided in the clean room and configured to generate heat during use;
a housing configured to cover the semiconductor manufacturing equipment and capable of introducing air inside said clean room into an interior thereof;
a plurality of exhaust passage members configured to exhaust air in said housing to outside said clean room; and
a heat insulating material provided on an outer surface of said housing and configured to reduce the release of heat from said housing to the air inside said clean room.

2. The semiconductor manufacturing facility as claimed in claim 1, further comprising a heat insulating material associated with said plurality of exhaust passage members so as to reduce the release of heat to the air inside said clean room.

3. A semiconductor manufacturing facility comprising:
a clean room;
a semiconductor manufacturing equipment provided in the clean room and configured to generate heat during use;
a housing configured to cover the semiconductor manufacturing equipment;
a plurality of exhaust passage members configured to exhaust air in said housing to outside said clean room;
a separation and enclosure member provided to isolate said housing from an atmosphere of said clean room by enclosing said housing, the separation and enclosure member configured to be capable of introducing air in said clean room into an interior thereof; and
a heat insulating material associated with said separation and enclosure member and configured to reduce the release of heat from the interior of said separation and enclosure member to the air inside said clean room.

4. A semiconductor manufacturing facility comprising:
a clean room;
a semiconductor manufacturing equipment provided in the clean room and configured to generate heat during use;
a housing configured to cover the semiconductor manufacturing equipment;
a plurality of exhaust passage members configured to exhaust air in said housing to outside said clean room;
an air introducing passage member configured to introduce air outside said clean room into said housing; and
a heat insulating material associated with said housing and configured to reduce the release of heat from the interior of said housing to the air inside said clean room.

5. The semiconductor manufacturing facility as claimed in claim 4, further comprising a heat insulating material associated with said plurality of exhaust passage members, thereby reducing the release of heat from said plurality of exhaust passage members to the air inside said clean room.

6. The semiconductor manufacturing facility as claimed in claim 5, further comprising a heat insulating material associated with said air introducing passage member.

7. A semiconductor manufacturing facility comprising:
a clean room;
a semiconductor manufacturing equipment provided in the clean room and configured to generate heat during use;

a housing configured to cover the semiconductor manufacturing equipment;

a plurality of exhaust passage members configured to exhaust air in said housing to outside said clean room;

a separation and enclosure member provided to isolate said housing from an atmosphere of said clean room by enclosing said housing;

an air introducing passage member provided to introduce air outside said clean room into a space between said separation and enclosure member and said housing, the air introducing passage member being provided with a heat insulating material; and another heat insulating material associated with said separation and enclosure member and configured to reduce the release of heat from the interior of said separation and enclosure member to the air inside said clean room.

8. The semiconductor manufacturing facility as claimed in claim 1 or 4, wherein at least one of said housing and said plurality of exhaust passage members has a heat reflection film which does not generate a gaseous contaminant.

9. The semiconductor manufacturing facility as claimed in claim 2 or 7, wherein at least one of said separation and enclosure member and said plurality of exhaust passage members has a heat reflection film which does not generate a gaseous contaminant.

10. The semiconductor manufacturing facility as claimed in claim 4, wherein said housing is hermetically sealed by a seal member which does not generate a gaseous contaminant.

11. The semiconductor manufacturing facility as claimed in claim 3 or 7, wherein said separation and enclosure member is hermetically sealed by a seal member which does not generate a gaseous contaminant.

12. The semiconductor manufacturing facility as claimed in one of claims 1 to 7, wherein said heat insulating member is formed of a material which does not generate a gaseous contaminant.

13. The semiconductor manufacturing facility as claimed in claim 12, wherein said heat insulating member is formed of a plastic foam.

14. The semiconductor manufacturing facility as claimed in one, of claims 1 to 7, wherein said heat insulating member is covered and sealed by a sheet material which does not generate a gaseous contaminant.

15. The semiconductor manufacturing facility as claimed in claim 14, wherein said sheet material is made of a metal plate, and wherein a metal panel is formed by the metal plate and said heat insulating material.

16. A semiconductor manufacturing apparatus arranged in a clean room and configured to generate heat when a predetermined process is applied to an object to be processed, said semiconductor manufacturing apparatus comprising:

a processing part configured to apply the predetermined process to said object to be processed;

a housing configured to cover the processing part and configured to be capable of introducing air inside said clean room into an interior thereof;

a first exhaust passage member configured to exhaust air in said housing to outside said clean room;

a heat insulating material provided on an outer surface of said housing to reduce the release of heat from said housing to said clean room.

17. The semiconductor manufacturing apparatus as claimed in claim 16, further comprising another heat insulating material associated with said first exhaust passage member to reduce the release of heat from said first exhaust passage member to the air inside said clean room.

18. The semiconductor manufacturing apparatus as claimed in claim 16, further comprising: a carry-out chamber provided to accommodate said object to be processed and associated with the processing part to carry out said processed object from said processing part; and a second exhaust passage member provided to exhaust air in the carry-out chamber to outside said clean room.

19. The semiconductor manufacturing apparatus as claimed in claim 18, further comprising a fan configured to introduce the air inside said clean room and a filter configured to filter the air passing through the fan.

20. The semiconductor manufacturing apparatus as claimed in one of claims 16 to 19, wherein said carry-out chamber is defined by said housing, and said carry-out chamber is isolated from a space in which said processing part is accommodated by a separation member.

21. A semiconductor manufacturing apparatus arranged in a clean room and configured to generate heat when a predetermined process is applied to an object to be processed, the semiconductor manufacturing apparatus comprising:

a processing part configured to apply the predetermined process to said object to be processed;

a carry-out chamber configured to accommodate said object to be processed and to carry the processed object out of said processing part;

a housing configured to cover said processing part and said carry-out chamber;

a first exhaust passage member configured to exhaust air into a surrounding area of said processing part to outside said clean room;

a second exhaust passage member configured to exhaust air into a surrounding area of said carry-out chamber to outside said clean room;

an air introducing passage member capable of introducing air inside the clean room into the surrounding area of said processing part;

air introducing means for introducing the air inside the clean room into the surrounding area of said carry-out chamber; and a plurality of heat insulating materials associated with said housing and said air introducing passage member, wherein at least one heat insulating material of the plurality of heat insulating materials is provided on an outer surface of the housing.

22. The semiconductor manufacturing apparatus as claimed in claim 21, further comprising another heat insulating material associated with said first exhaust passage member and said second exhaust passage member.

23. A method for manufacturing a semiconductor device by using a semiconductor manufacturing apparatus comprising:

a processing part configured to apply predetermined process to said object to be processed;

a carry-out chamber configured to accommodate said object to be processed and to carry the processed object out of said processing part;

a housing configured to cover said processing part and said carry-out chamber;

a first exhaust passage member configured to exhaust air in a surrounding area of said processing part to outside said clean room;

a second exhaust passage member configured to exhaust air in a surrounding area of said carry-out chamber to outside said clean room;

an air introducing passage member capable of introducing air inside the clean room into the surrounding area of said processing part;

air introducing means for introducing the air inside the clean room into the surrounding area of said carry-out chamber; and a plurality of heat insulating materials associated with said housing and said air introducing passage member, at least one heat insulating material of the plurality of heat insulating materials being provided on an outer surface of the housing, the method comprising:

introducing air outside said clean room into the surrounding area of said processing part through said air introducing passage member;

exhausting the air through the first exhaust passage to outside said clean room;

introducing air inside said clean room through the air introducing means into the surrounding area of said carry-out chamber; and exhausting the air through the second exhaust passage to outside said clean room.

* * * * *